(12) United States Patent
Servalli et al.

(10) Patent No.: US 12,501,623 B2
(45) Date of Patent: Dec. 16, 2025

(54) FORMATION FOR MEMORY CELLS

(71) Applicant: Micron Technology, Inc., Boise, ID (US)

(72) Inventors: Giorgio Servalli, Fara Gera d'Adda (IT); Durai Vishak Nirmal Ramaswamy, Boise, ID (US); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 347 days.

(21) Appl. No.: 18/204,773

(22) Filed: Jun. 1, 2023

(65) Prior Publication Data

US 2023/0397431 A1    Dec. 7, 2023

Related U.S. Application Data

(60) Provisional application No. 63/365,732, filed on Jun. 2, 2022.

(51) Int. Cl.
  *H10B 53/20* (2023.01)
  *H01L 23/522* (2006.01)
  *H01L 23/528* (2006.01)
  *H10B 53/10* (2023.01)

(52) U.S. Cl.
  CPC ......... *H10B 53/20* (2023.02); *H01L 23/5226* (2013.01); *H01L 23/5283* (2013.01); *H10B 53/10* (2023.02)

(58) Field of Classification Search
  CPC ..... H10B 53/20; H10B 53/10; H01L 23/5226; H01L 23/5283
  USPC ........................................................ 257/295
  See application file for complete search history.

(56) References Cited

U.S. PATENT DOCUMENTS 11,928,177 B2 *    3/2024    Luo ........................ G06F 1/03

* cited by examiner

*Primary Examiner* — Tu-Tu V Ho
(74) *Attorney, Agent, or Firm* — Holland & Hart LLP

(57) ABSTRACT

Methods, systems, and devices for formation for memory cells are described. A semiconductor device (e.g., a memory die) may include asymmetrical rows of conductive pillars and one or more dielectric materials. For example, the memory die may include a set of conductive pillars that are arranged in rows that are asymmetrically spaced. Here, a first row of conductive pillars may be a first distance away from a second row of conductive pillars and a second, larger distance away from a third row of conductive pillars. Additionally, the memory die may include one or more dielectric materials. In some cases, when depositing a dielectric material as part of a self-aligning process, the material may conformally line exposed surfaces according to a substantially uniform depth, which may decrease a subsequent quantity of masking operations to form the memory die.

20 Claims, 16 Drawing Sheets

SECTION B-B'

SECTION C-C'

SECTION A-A'

FORMATION FOR MEMORY CELLS

CROSS REFERENCE

The present Application for Patent claims the benefit of U.S. Provisional Patent Application No. 63/365,732 by Servalli et al., entitled "FORMATION FOR MEMORY CELLS," filed Jun. 2, 2022, assigned to the assignee hereof, and expressly incorporated by reference herein.

FIELD OF TECHNOLOGY

The following relates to one or more systems for memory, including formation for memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
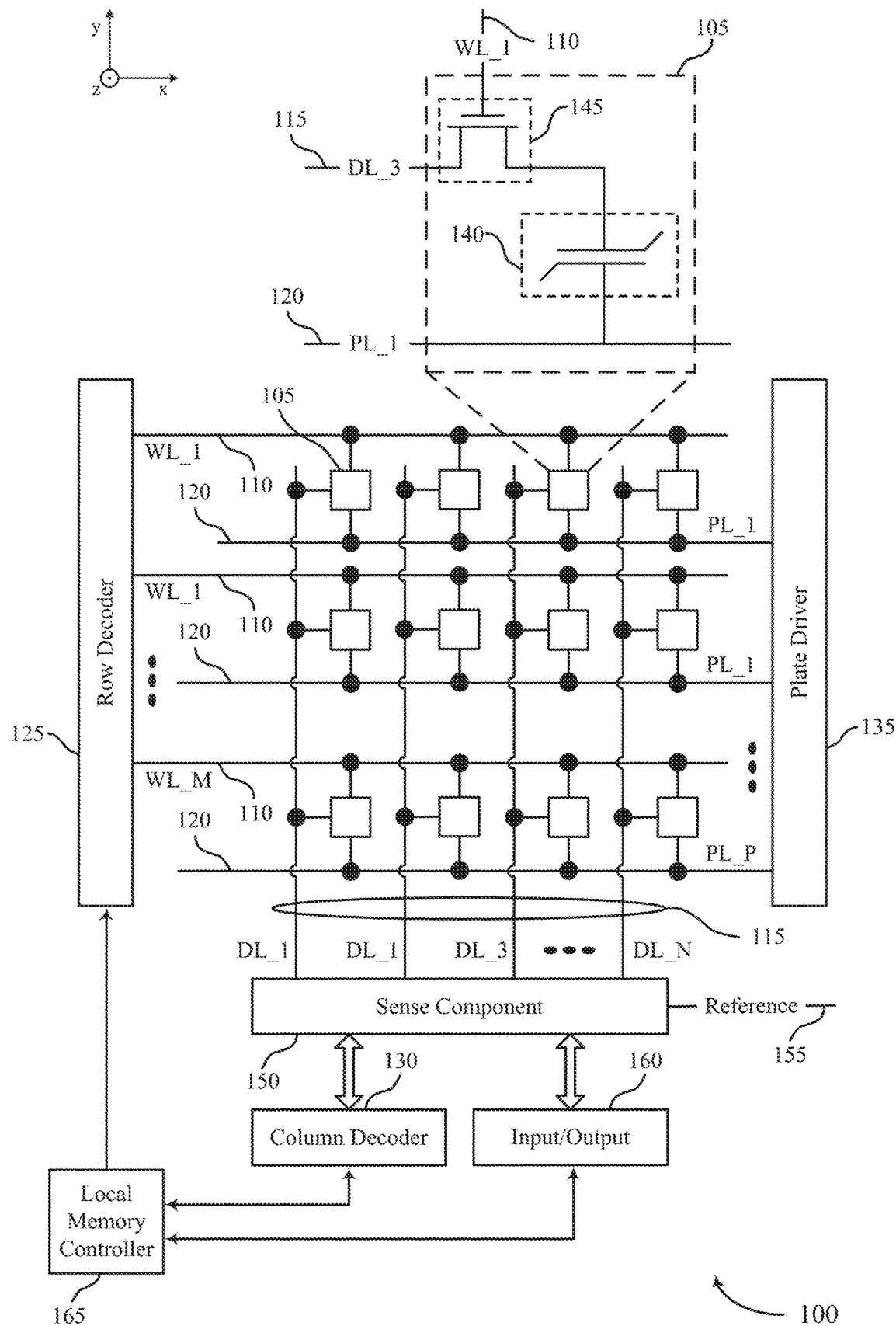
FIG. 1 illustrates top view of an example memory device that supports formation for memory cells in accordance with examples as disclosed herein.

In some semiconductor manufacturing operations, voids may be formed between materials deposited over a substrate, and other materials may be deposited in the voids (e.g., between the materials) to form various circuit structures. In some cases, the voids may be selectively formed, where some portions of the materials are removed to form the void while other portions of the materials are conserved. In these cases, the manufacturing operations may additionally include masking operations, where a mask is applied to the portions of the materials that are conserved in a subsequent manufacturing operations (e.g., etching operations) to form one or more voids. However, in some examples, performing masking operations may be time-intensive and may increase an amount of time to execute the manufacturing operation to form a semiconductor device (e.g., a memory die). Additionally, small variations in manufacturing processes may cause misalignment with masking, etching, and deposition processes.

In accordance with examples as disclosed herein, manufacturing operations to form a memory die may include forming asymmetrical rows of conductive pillars and using one or more self-aligning techniques, which may reduce a quantity of masking operations to form the memory die. For example, the memory die may include a set of conductive pillars that are arranged in rows that are asymmetrically spaced. Here, a first row of conductive pillars may be a first distance away from a second row of conductive pillars and a second, larger distance away from a third row of conductive pillars. Additionally, the memory die may include one or more dielectric materials used to apply self-aligning techniques. In some cases, when depositing a material used for a self-aligning process, the material may conformally line exposed surfaces according to a substantially uniform depth, which may decrease a subsequent quantity of etching operations. Additionally, etching operations may be associated with a masking operation (e.g., to conserve portions of the materials during the etching operation). Thus, by decreasing the subsequent quantity of etching operations, the subsequent quantity of masking operations may also be decreased. By implementing manufacturing operations to form a memory die including the asymmetrical rows of conductive pillars and one or more dielectric materials, the quantity of masking operations included in the manufacturing operations to form the memory die may be less as compared to manufacturing operations to form a similar memory die without asymmetrical rows of conductive pillars or the one or more self-aligning techniques.

Features of the disclosure are initially described in the context of a memory array as described with reference to FIG. 1. Features of the disclosure are described in the context of material arrangements and related manufacturing operations with reference to FIGS. 2 through 14. These and other features of the disclosure are further illustrated by and described with reference to flowcharts that relate to formation for memory cells as described with reference to FIGS. 15 and 16.

FIG. 1 illustrates an example of a memory device 100 that supports formation for memory cells in accordance with examples as disclosed herein. In some examples, the memory device 100 may be referred to as a memory chip, a memory device, and an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that may each be programmable to store different logic states (e.g., programmed to one of a set of two or more possible states). For example, a memory cell 105 may be operable to store one bit of information at a time (e.g., a logic 0 or a logic 1). In some examples, a memory cell 105 (e.g., a multi-level memory cell) may be operable to store more than one bit of information at a time (e.g., a logic 00, logic 01, logic 10, a logic 11).

In some examples, a memory cell 105 may store a state (e.g., a polarization state, a dielectric charge) representative of the programmable states in a capacitor. The memory cell 105 may include a logic storage component, such as capacitor 140, and a switching component 145 (e.g., a cell selection component). A first node of the capacitor 140 may be coupled with the switching component 145 and a second node of the capacitor 140 may be coupled with a plate line 120. The switching component 145 may be an example of a transistor and any other type of switch device that selectively establishes or de-establishes electronic communication between two components. In FeRAM architectures, the memory cell 105 may include a capacitor 140 (e.g., a ferroelectric capacitor) that includes a ferroelectric material to store a charge (e.g., a polarization) representative of the programmable state.

The memory device 100 may include access lines (e.g., word lines 110, digit lines 115, plate lines 120) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines and bit lines. References to access lines, row lines, column lines, word lines, digit lines, bit lines, and plate lines, and their analogues, are interchangeable without loss of understanding. Memory cells 105 may be positioned at intersections of the word lines 110, the digit lines 115, or the plate lines 120.

Operations such as reading and writing may be performed on memory cells 105 by activating access lines such as a word line 110, a digit line 115, or a plate line 120. By biasing a word line 110, a digit line 115, and a plate line 120 (e.g., applying a voltage to the word line 110, digit line 115, or plate line 120), a single memory cell 105 may be accessed at their intersection. The intersection of a word line 110 and a digit line 115 in a two-dimensional or in a three-dimensional configuration may be referred to as an address of a memory cell 105. Activating a word line 110, a digit line 115, or a plate line 120 may include applying a voltage to the respective line.

Accessing the memory cells 105 may be controlled through a row decoder 125, a column decoder 130, or a plate driver 135, or any combination thereof. For example, a row decoder 125 may receive a row address from the local memory controller 165 and activate a word line 110 based on the received row address. A column decoder 130 may receive a column address from the local memory controller 165 and activate a digit line 115 based on the received column address. A plate driver 135 may receive a plate address from the local memory controller 165 and activate a plate line 120 based on the received plate address.

Selecting or deselecting the memory cell 105 may be accomplished by activating or deactivating the switching component 145. The capacitor 140 may be in electronic communication with the digit line 115 using the switching component 145. For example, the capacitor 140 may be isolated from digit line 115 when the switching component 145 is deactivated, and the capacitor 140 may be coupled with digit line 115 when the switching component 145 is activated.

A word line 110 may be a conductive line in electronic communication with a memory cell 105 that is used to perform access operations on the memory cell 105. In some architectures, the word line 110 may be in electronic communication with agate of a switching component 145 of a memory cell 105 and may be operable to control the switching component 145 of the memory cell. In some architectures, the word line 110 may be in electronic communication with a node of the capacitor of the memory cell 105 and the memory cell 105 may not include a switching component.

A digit line 115 may be a conductive line that couples the memory cell 105 with a sense component 150. In some architectures, the memory cell 105 may be selectively coupled with the digit line 115 during portions of an access operation. For example, the word line 110 and the switching component 145 of the memory cell 105 may be operable to selectively couple or isolate the capacitor 140 of the memory cell 105 and the digit line 115. In some architectures, the memory cell 105 may be in electronic communication (e.g., constant) with the digit line 115.

A plate line 120 may be a conductive line in electronic communication with a memory cell 105 that is used to perform access operations on the memory cell 105. The plate line 120 may be in electronic communication with a node (e.g., the cell bottom) of the capacitor 140. The plate line 120 may cooperate with the digit line 115 to bias the capacitor 140 during access operation of the memory cell 105.

The sense component 150 may determine a state (e.g., a polarization state, a charge) stored on the capacitor 140 of the memory cell 105 and determine a logic state of the memory cell 105 based on the detected state. The sense component 150 may include one or more sense amplifiers to amplify the signal output of the memory cell 105. The sense component 150 may compare the signal received from the memory cell 105 across the digit line 115 to a reference 155 (e.g., a reference voltage, a reference line). The detected logic state of the memory cell 105 may be provided as an output of the sense component 150 (e.g., to an input/output 160), and may indicate the detected logic state to another component of a memory device 100.

The local memory controller 165 may control the operation of memory cells 105 through the various components (e.g., row decoder 125, column decoder 130, plate driver 135, and sense component 150). In some examples, one or more of the row decoder 125, column decoder 130, and plate driver 135, and sense component 150 may be co-located with the local memory controller 165. The local memory controller 165 may be operable to receive one or more of commands or data from one or more different memory controllers (e.g., an external memory controller associated with a host device, another controller associated with the memory device 100), translate the commands or the data (or both) into information that can be used by the memory device 100, perform one or more operations on the memory device 100, and communicate data from the memory device 100 to a host device based on performing the one or more operations. The local memory controller 165 may generate row signals and column address signals to activate the target word line 110, the target digit line 115, and the target plate line 120. The local memory controller 165 also may generate and control various signals (e.g., voltages, currents) used during the operation of the memory device 100. In general, the amplitude, the shape, or the duration of an applied voltage or current discussed herein may be varied and may be different for the various operations discussed in operating the memory device 100.

The local memory controller 165 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 165 in response to various access commands (e.g., from a host device). The local memory controller 165 may be operable to perform other access operations not listed here or other operations related to the operating of the memory device 100 that are not directly related to accessing the memory cells 105.

In some techniques for manufacturing a memory device 100 (e.g., for manufacturing a semiconductor die that includes one or more aspects of the memory device 100), voids may be formed between materials deposited over a substrate, and other materials may be deposited in the voids to form various circuit structures. In some cases, the voids may be selectively formed, where some portions of the materials are removed to form the void while other portions of the materials are conserved. In these cases, the manufacturing operations may additionally include masking operations, where a mask is applied to the portions of the materials that are conserved in a subsequent manufacturing operations (e.g., etching operations) to form one or more voids. However, in some examples, performing masking operations may be time-intensive and may increase an amount of time to execute the manufacturing operation to form the memory device 100.

In accordance with examples as disclosed herein, manufacturing operations to form the memory device 100 may include forming asymmetrical rows of conductive pillars and using one or more materials and self-aligning techniques, which may reduce a quantity of masking operations to form the memory device 100. For example, the memory device 100 may include a set of conductive pillars that are arranged in rows that are asymmetrically spaced. Here, a first row of conductive pillars may be a first distance away from a second row of conductive pillars and a second, larger distance away from a third row of conductive pillars. In some cases, the conductive pillars may correspond to one plate of a capacitor 140. For example, the conductive pillars may correspond to a plate of the capacitor 140 associated with a node that is in electronic communication with the digit line 115 (e.g., via a switching component 145).

Additionally, the memory device 100 may include one or more self-aligning materials formed using self-aligning techniques. In some cases, when depositing a material, the material may conformally line exposed surfaces according to a substantially uniform depth, which may decrease a subsequent quantity of etching operations. Additionally, etching operations may be associated with a masking operation (e.g., to conserve portions of the materials during the etching operation). Thus, by decreasing the subsequent quantity of etching operations, the subsequent quantity of masking operations may also be decreased. By implementing manufacturing operations to form the memory device 100 including the asymmetrical rows of conductive pillars and one or more dielectric materials, the quantity of masking operations included in the manufacturing operations to form the memory device 100 may be less as compared to manufacturing operations to form a similar memory device 100 without asymmetrical rows of conductive pillars or the one or more self-aligning techniques.

FIGS. 2 through 14 illustrate examples of fabrication operations that may support trench and pier architectures for three-dimensional memory arrays in accordance with examples as disclosed herein. For example, FIGS. 2 through 14 may illustrate operations for fabricating aspects of a material arrangement 200, which may be a portion of a memory device (e.g., a portion of a memory device 100). Each of FIGS. 2 through 14 may illustrate aspects of the material arrangement 200 after different subsets of or alternatives of the fabrication operations for forming the material arrangement 200 (e.g., illustrated as a material arrangement 200-a after a first set of one or more manufacturing operations, as a material arrangement 200-b after a second set of one or more manufacturing operations, and so on). Each view of FIGS. 2 through 14 may be described with reference to an x-direction, a y-direction, and a z-direction, as illustrated, which may correspond to the respective directions described with reference to the memory device 100.

Each of FIGS. 2 through 14 include section views that illustrate example cross-sections of the material arrangement 200. For example, in FIGS. 2 through 14, a plan view "Plan View" may be associated with a top plan view of the material arrangement 200, a view "SECTION B-B'" may be associated with a cross-section in an xz-plane (e.g., in accordance with a cut plane B-B') through a portion of the material arrangement 200, and a view "SECTION C-C'" may be associated with a cross-section in an yz-plane (e.g., in accordance with a cut plane C-C') through a portion of the material arrangement 200. In some cases, the plan view of the material arrangement 200 may show structures that are beneath other structures. By making some upper layers opaque, certain details (such as contacts) may be viewed in the plan view and highlight the relative positions of certain elements and features. Although the material arrangement 200 illustrates examples of some relative dimensions and quantities of various features, aspects of the material arrangement 200 may be implemented with other relative dimensions or quantities of such features in accordance with examples as disclosed herein.

Operations illustrated in and described with reference to FIGS. 2 through 14 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 2:
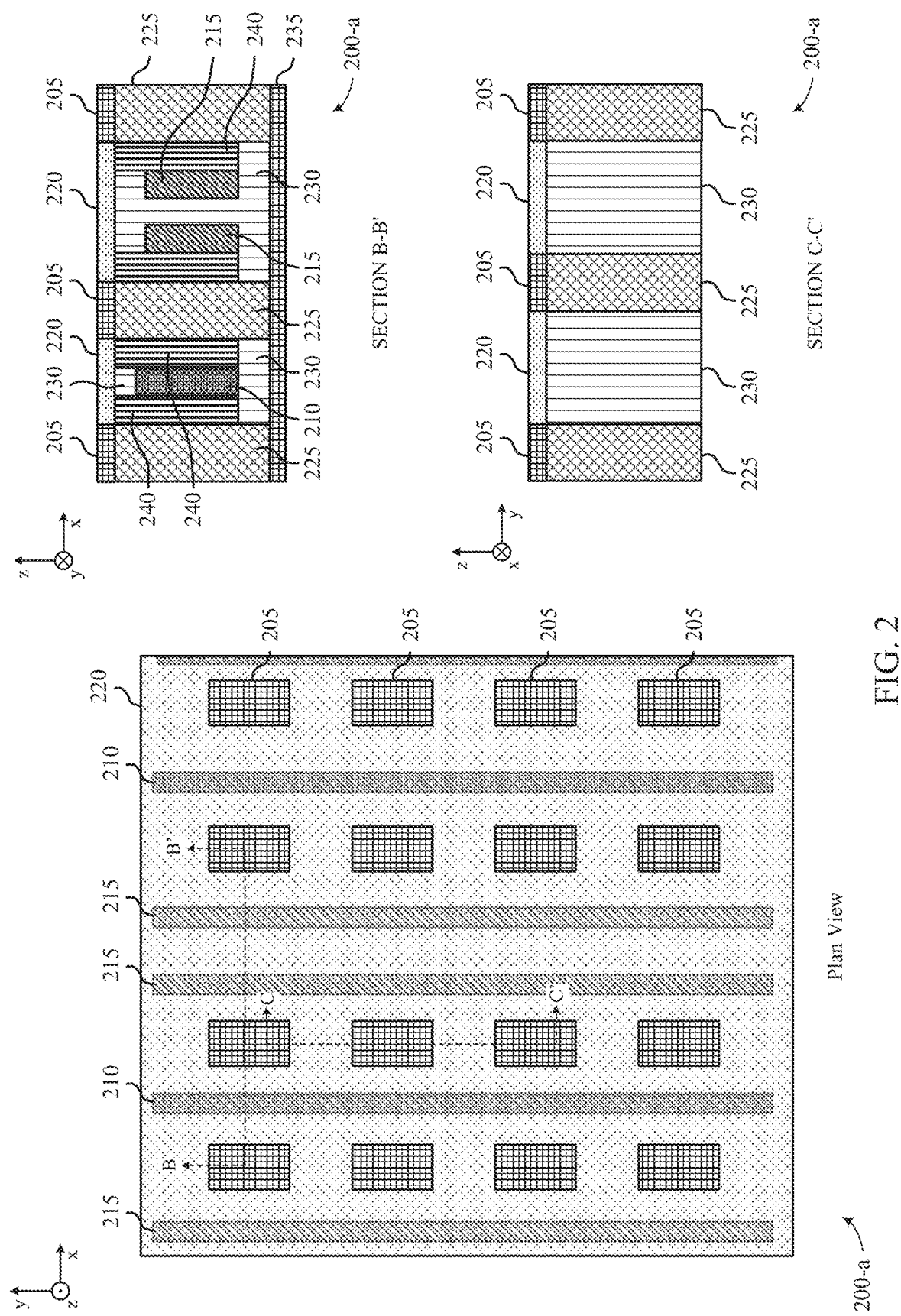
FIGS. 2 through 14 illustrate examples of operations that support formation for memory cells in accordance with examples as disclosed herein.

FIG. 2 illustrates an example of a material arrangement 200 (e.g., as a material arrangement 200-a) after a first set of one or more manufacturing operations. The first set of operations may include any combination of deposition operations, masking operations, and etching operations to form the material arrangement 200-a. In some cases, the material arrangement 200-a may correspond to a substrate over which subsequent materials are deposited (e.g., for other material arrangements 200).

The substrate (e.g., corresponding to the material arrangement 200-a) may include a set of word lines 215 and shield lines 210, which extend along the substrate along the y-direction. The word lines 215 and the shield lines 210 may include a metal or other conductive material. In some cases, the material arrangement 200-a may additionally include one or more additional dielectric materials, such as dielectric material 230 (e.g., an oxide material) and dielectric material 240 (e.g., an oxide material), each of which may be an oxide material. While the dielectric materials 230 and 240 are illustrated as distinct materials, in some examples, the material arrangement 200-a may include a single dielectric material instead of both the dielectric materials 230 and 240.

A top surface of the substrate (e.g., corresponding to the material arrangement 200-*a*) may include a set of conductive contacts 205 surrounded by a dielectric material 220. The dielectric material 220 may be a nitride (e.g., a tier nitride, a nitride of silicon). The contacts 205 may be arranged in rows along the x-direction, where each row of contacts 205 is coupled with a digit line 235 via semiconductor material 225, which may be an example of a silicon material. Here, each of the digit lines 235 may also extend along the x-direction. In some cases, each of the contacts 205 may correspond to a top surface of a transistor pillar (e.g., a thin-film-transistor (TFT) pillar), which may in turn be an example of a switching component 145 as described with reference to FIG. 1. The transistor pillar may additionally include the semiconductor material 225. Here, a contact 205 may be coupled with a corresponding digit line 235 in cases that a voltage is applied to the word line 215 (e.g., that is electrically coupled with the semiconductor material 225 via the dielectric material 245).

Figure 3:
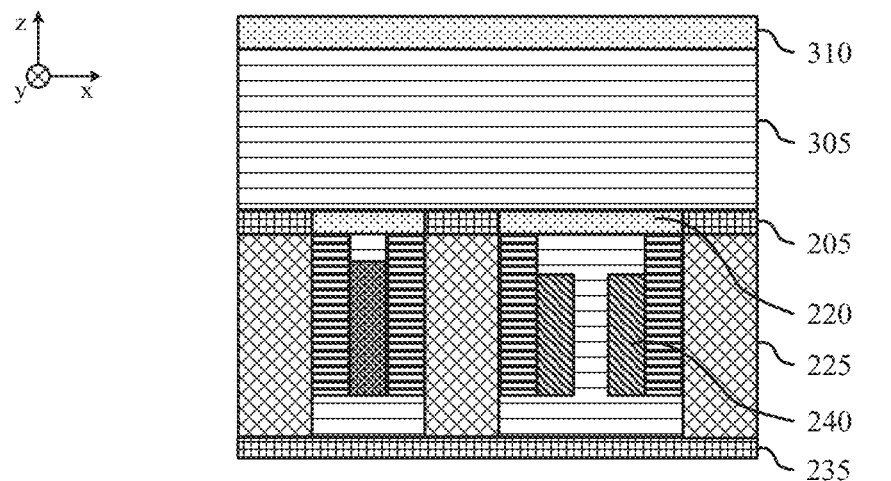
Figure 3:
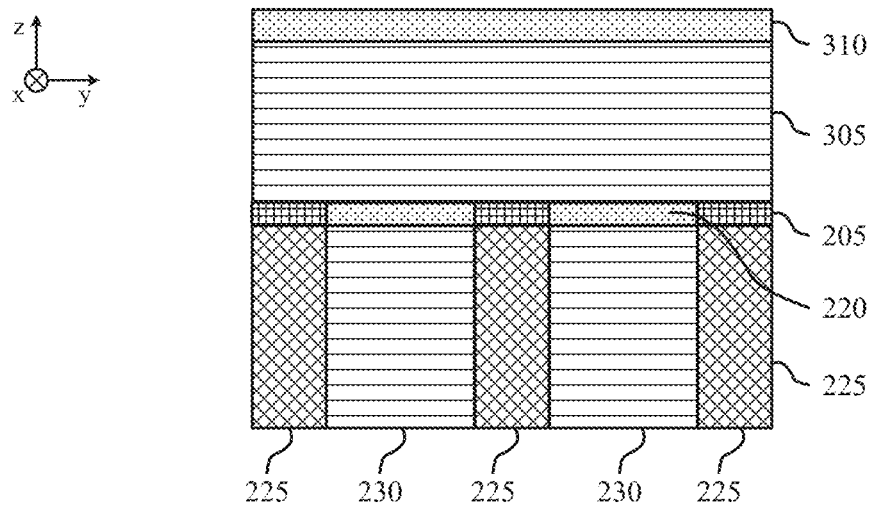

FIG. 3 illustrates the material arrangement 200 (e.g., as a material arrangement 200-*b*) after a second set of one or more manufacturing operations. In some examples, forming the material arrangement 200-*b* may include performing a first deposition operation to deposit a dielectric material 305 over the substrate (e.g., the material arrangement 200-*a*). After depositing the dielectric material 305, the dielectric material 305 may be coupled with the contacts 205 and the dielectric material 220 corresponding to a top surface of the substrate. In some cases, the dielectric material 305 may be an oxide. Additionally, depositing the dielectric material 305 over the substrate may include depositing the dielectric material 305 with a depth that is greater than 870 nanometers. The second set of operations may also include a second deposition operation to deposit a dielectric material 310 over the dielectric material 305. For example, the second set of manufacturing operations may include performing the second deposition operation after performing the first deposition operation. In some cases, the dielectric material 310 may be a nitride (e.g., a tier nitride, a nitride of silicon).

Figure 4:
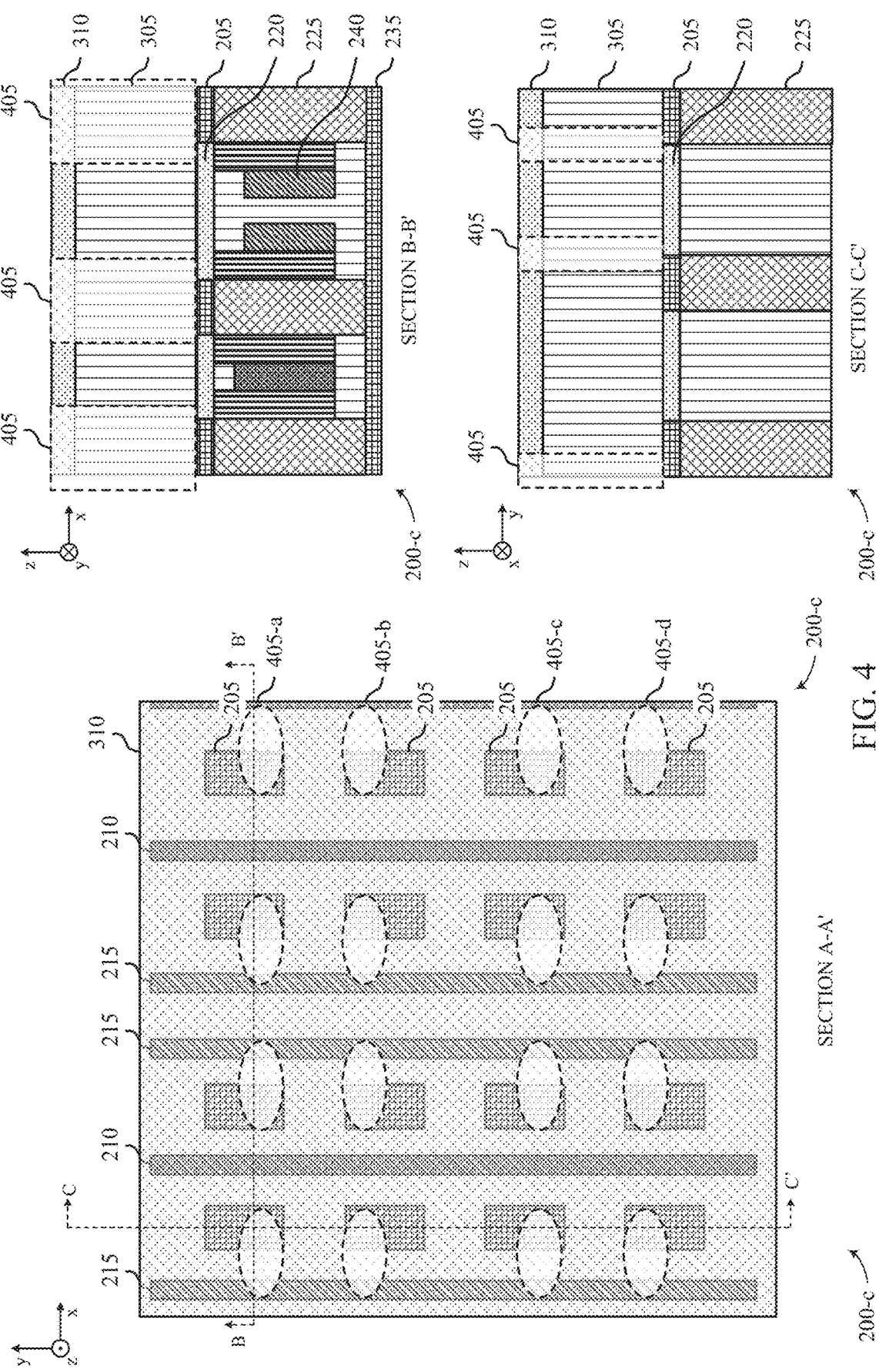

FIG. 4 illustrates the material arrangement 200 (e.g., as a material arrangement 200-*c*) after a third set of one or more manufacturing operations. In some examples, forming the material arrangement 200-*c* may include performing a masking operation. Based on performing the masking operation, the material arrangement 200-*c* may include a set of asymmetrical rows of exposed portions 405 of the dielectric material 310 while the remaining portions of the dielectric material 310 are covered by a masking material. That is, a first distance between a first row of the exposed portions 405 of the dielectric material 310 (e.g., including the portion 405-*a*) and a second row of the exposed portions 405 (e.g., including the portion 405-*b*) may be different than (e.g., smaller than) a second distance between the second row of exposed portions 405 and a third row of the exposed portions 405 (e.g., including the portion 405-*c*). For example, the first distance between the first row and the second row may be approximately 10 nanometers while the third distance between the second row and the third row may be approximately 30 nanometers. In some cases, each of the exposed portions 405 of the dielectric material 310 may elliptical. That is, a width of each of the exposed portions 405 (e.g., along the x-direction) may be larger than a height of each of the exposed portions 405 (e.g., along the y-direction). For example, the width of the exposed portions 405 may be approximately 20 nanometers, while a height of the exposed portions 405 may be approximately 10 nanometers. In some other cases, each of the exposed portions 405 of the dielectric material 310 may be spherical.

In some cases, the masking operation may include depositing a masking material (e.g., a mask) over the material arrangement 200-*b*. After depositing the masking material over the material arrangement 200-*b*, the masking operation may include patterning the masking material. For example, the masking material may be patterned to expose the portions 405 of the dielectric material 310. In the example of the material arrangement 200-*c*, the exposed portions 405 of the dielectric material 310 (e.g., not covered by the masking material) may be positioned at least partially above one of the contacts 205 of the substrate.

In some cases, the masking operation may include patterning symmetrical rows of exposed portions 405 of the dielectric material 310 (e.g., rows of the exposed portions 405 that are equidistance apart). For example, another row of exposed portions 405 of the dielectric material 310 may be patterned between the second row of exposed portions 405 (e.g., including the portion 405-*b*) and the third row of exposed portions 405 (e.g., including the portion 405-*c*). Here, the masking operation may additionally include depositing a masking material over a subset of the rows of exposed portions 405 of the dielectric material 310. For example, the third set of operations may include depositing a patch mask over every third row of exposed portions 405 of the dielectric material 310. Thus, the third set of operations may form the asymmetrical rows of exposed portions 405 of the dielectric material 310.

In some other cases, the asymmetrical rows of exposed portions 405 of the dielectric material 310 may instead be formed using an extreme ultraviolet (EUV) technique. Additionally, or alternatively, the third set of manufacturing operations (e.g., the masking operation) that form the asymmetrical rows of exposed portions 405 of the dielectric material 310 may include a combination of an immersion operation and a sub-resolution assist feature (SRAF) operation.

Figure 5:
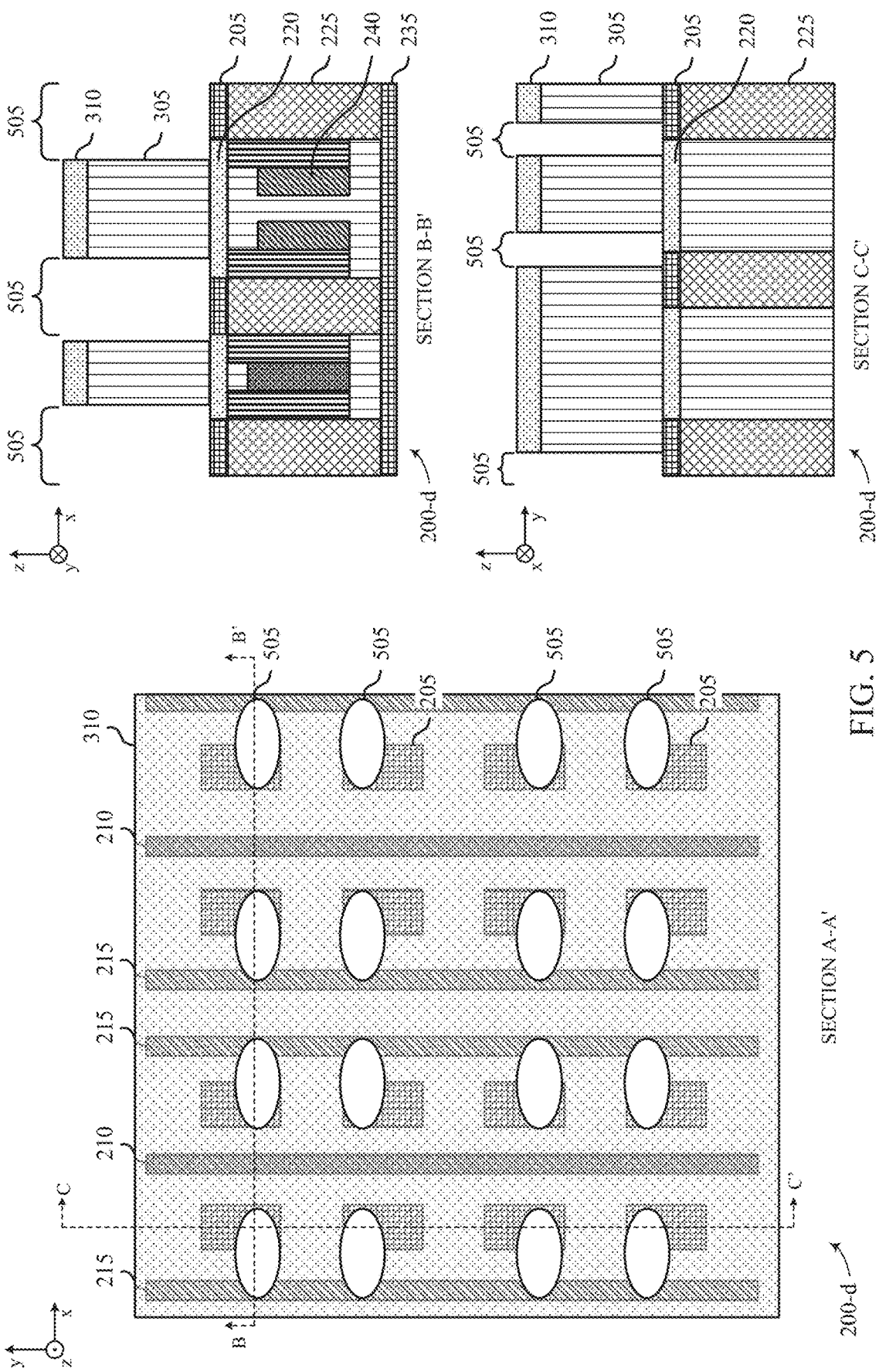

FIG. 5 illustrates the material arrangement 200 (e.g., as a material arrangement 200-*d*) after a fourth set of one or more manufacturing operations. The fourth set of manufacturing operations may include an etching operation to form cavities 505. For example, the fourth set of operations may include a dry etching operation (e.g., a reactive ion etching (RIE)) that supports material removal that is preferentially directional along the z-direction to remove portions of the dielectric material 310 and the dielectric material 305 not covered by a masking material (e.g., in the material arrangement 200-*c*). That is, the etching operation may remove the exposed portions of the dielectric material 310 in addition to portions of the dielectric material 310 and 305 below the exposed portions 405 of the dielectric material 310. In some cases, the remaining portions of the dielectric material 310 may contiguous after performing the etching operation to form the cavities 505. The cavities 505 may expose a top surface of the substrate, including at least a portion of each of the contacts 205. Additionally, the cavities 505 may expose portions of the dielectric material 220. Each of the cavities 505 may extend along z-direction from a top surface of the material arrangement 200-*d* to the substrate (e.g., including exposed portions of the contacts 205 and the dielectric material 220). Additionally, while the cavities 505 are illustrated as being elliptical, the cavities 505 may be other shapes (e.g., circular).

Figure 6:
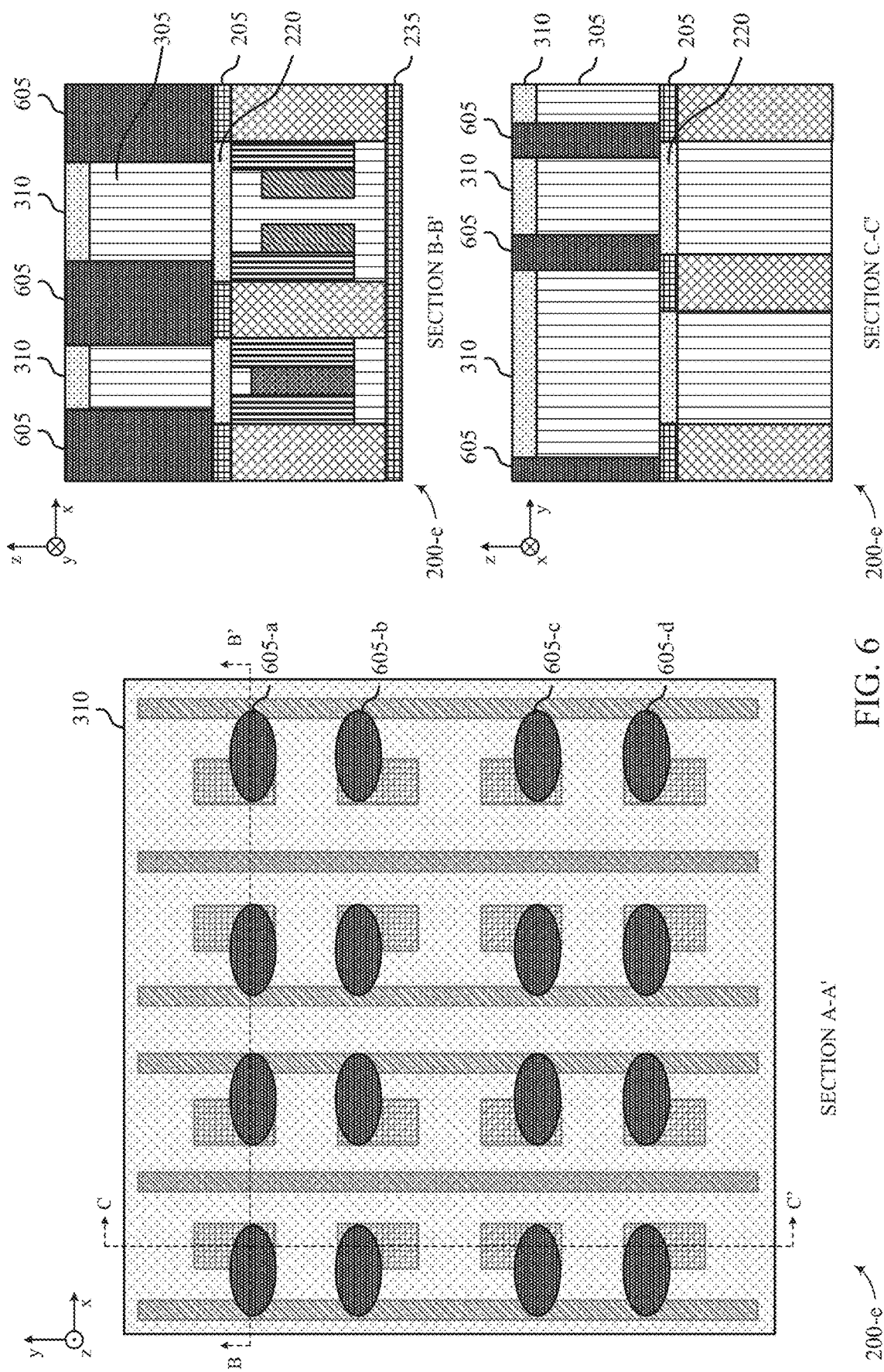

FIG. 6 illustrates the material arrangement 200 (e.g., as a material arrangement 200-*e*) after a fifth set of one or more manufacturing operations. The fifth set of manufacturing operations may include a deposition operation to deposit a conductive material in the cavities 505 to form conductive pillars 605. In some cases, the fifth set of manufacturing operations may additionally include an etching operation (e.g., an etchback operation such as a dry etching operation that supports material removal that is preferentially directional along the z-direction) to remove conductive material from a top surface of the dielectric material 310. Performing the fifth set of manufacturing operations may form a set of conductive pillars 605 in the material arrangement 200-e. Each conductive pillar 605 may be coupled with at least a portion of a contact 205. Thus, the conductive pillars 605 may be coupled with the digit line 235 via the contacts 205. Additionally, the sidewalls of the conductive pillars 605 may be coupled with the dielectric material 310 and the dielectric material 305.

In some cases, the conductive pillars 605 may be arranged in rows that are asymmetrically spaced. That is, a first distance between a first row of the conductive pillars 605 (e.g., including the conductive pillar 605-a) and a second row of the conductive pillars 605 (e.g., including the conductive pillar 605-b) may be different than (e.g., smaller than) a second distance between the second row of conductive pillars 605 and a third row of the conductive pillars 605 (e.g., including the conductive pillar 605-c). For example, the first distance between the first row and the second row may be approximately 10 nanometers while the third distance between the second row and the third row may be approximately 30 nanometers. In some cases, the conductive pillars 605 may be elliptical. That is, a width of the conductive pillars 605 along the x-direction may be larger than a width of the conductive pillars 605 along the y-direction. For example, a width of a conductive pillar 605 along the x-direction may be approximately 20 nanometers, while a width of the conductive pillar 605 along the y-direction may be approximately 10 nanometers.

Figure 7:
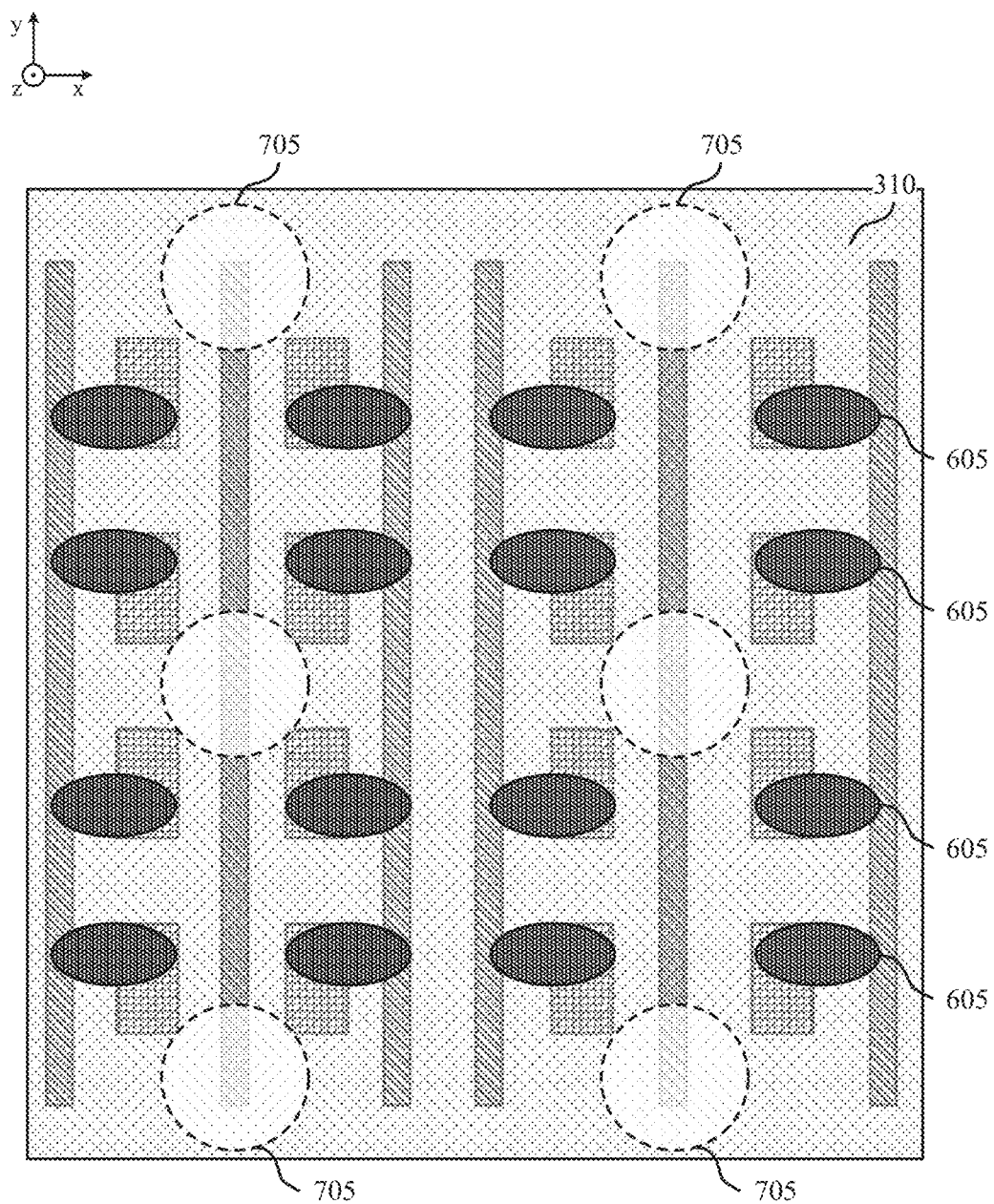

FIG. 7 illustrates the material arrangement 200 (e.g., as a material arrangement 200-f) after a sixth set of one or more manufacturing operations. In some examples, forming the material arrangement 200-f may include performing a masking operation. Based on performing the masking operation, the material arrangement 200-f may include a set of exposed portions 705 of the dielectric material 310 while the remaining portions of the dielectric material 310 and top surfaces of the conductive pillars 605 are covered by a masking material. In some cases, the masking operation may include depositing a masking material (e.g., a mask) over the material arrangement 200-e. After depositing the masking material over the material arrangement 200-e, the masking operation may include patterning the masking material. For example, the masking material may be patterned to expose the portions 705 of the dielectric material 310.

In the example of the material arrangement 200-f, the exposed portions 705 of the dielectric material 310 may be approximately 30 nanometers in diameter, separated in the x-direction by approximately 64 nanometers, and separated in the y-direction by approximately 60 nanometers, but other examples of the material arrangement 200-f may include exposed portions 705 of the dielectric material with other dimensions. Additionally, in the example of the material arrangement 200-f the exposed portions 705 of the dielectric material 310 are illustrated as circular, but other shapes of the exposed portions 705 may instead be formed by the sixth set of manufacturing operations. Additionally, the quantity of exposed portions 705 may be different than the illustrated quantity of exposed portions 705 in cases where the portions of the dielectric material 310 covered by the masking material is contiguous and the top surfaces of the conductive pillars 605 are covered by the masking material.

Figure 8:
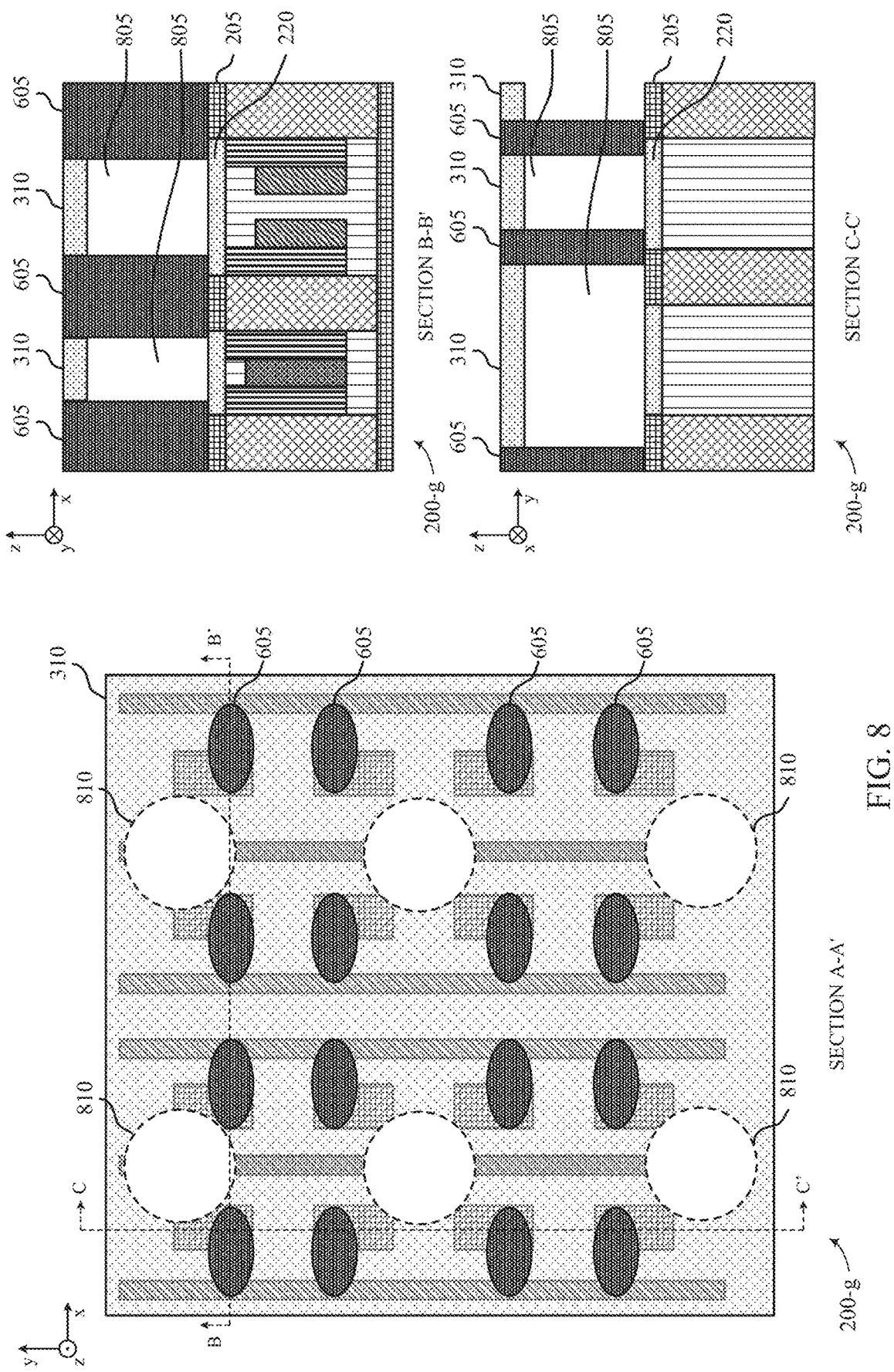

FIG. 8 illustrates the material arrangement 200 (e.g., as a material arrangement 200-g) after a seventh set of one or more manufacturing operations. The seventh set of manufacturing operations may form the cavities 805. For example, the seventh set of operations may include removing the exposed portions 705 of the dielectric material 310 (e.g., not covered by a masking material after performing the sixth set of manufacturing operations) to form the holes 810 in the dielectric material 310. After forming the holes 810 in the dielectric material 310, the seventh set of operations may include removing (e.g., etching, exhuming) the dielectric material 305 (e.g., that includes an oxide) from the material arrangement 200-f to form the material arrangement 200-g. In some cases, removing the dielectric material 305 may include performing a wet etch operation on the material arrangement 200-f that preferentially removes the dielectric material 305 (e.g., a wet oxide exhumation). Here, the wet etch operation may be performed by applying a wet etch material (e.g., that preferentially removes the dielectric material 305) to the material arrangement 200-f via the holes 810 of the dielectric material 310.

The seventh set of manufacturing operations may expose sidewalls, or portions of sidewalls, of the conductive pillars 605. For example, the cavities 805 may extend along the y-direction from a bottom surface of the dielectric material 310 to a top surface of the dielectric material 220. Additionally, the cavities 805 may extend along the x-direction from a sidewall of a first conductive pillar 605 to a sidewall of a second conductive pillar 605.

In some cases, after removing the portions 705 of the dielectric material 310 (e.g., the portions 705 of the dielectric material 310 not covered by a masking material in the sixth set of manufacturing operations) to form the holes 810 in the dielectric material 310, the dielectric material 310 may contiguously surround each of the conductive pillars 605. Additionally, the contiguous dielectric material 310 above the cavities 805 may increase a mechanical stability of the material arrangement 200-g. That is, the dielectric material 310 may prevent the conductive pillars 605 from buckling after removing the dielectric material 305 to form the cavities 805.

Figure 9:
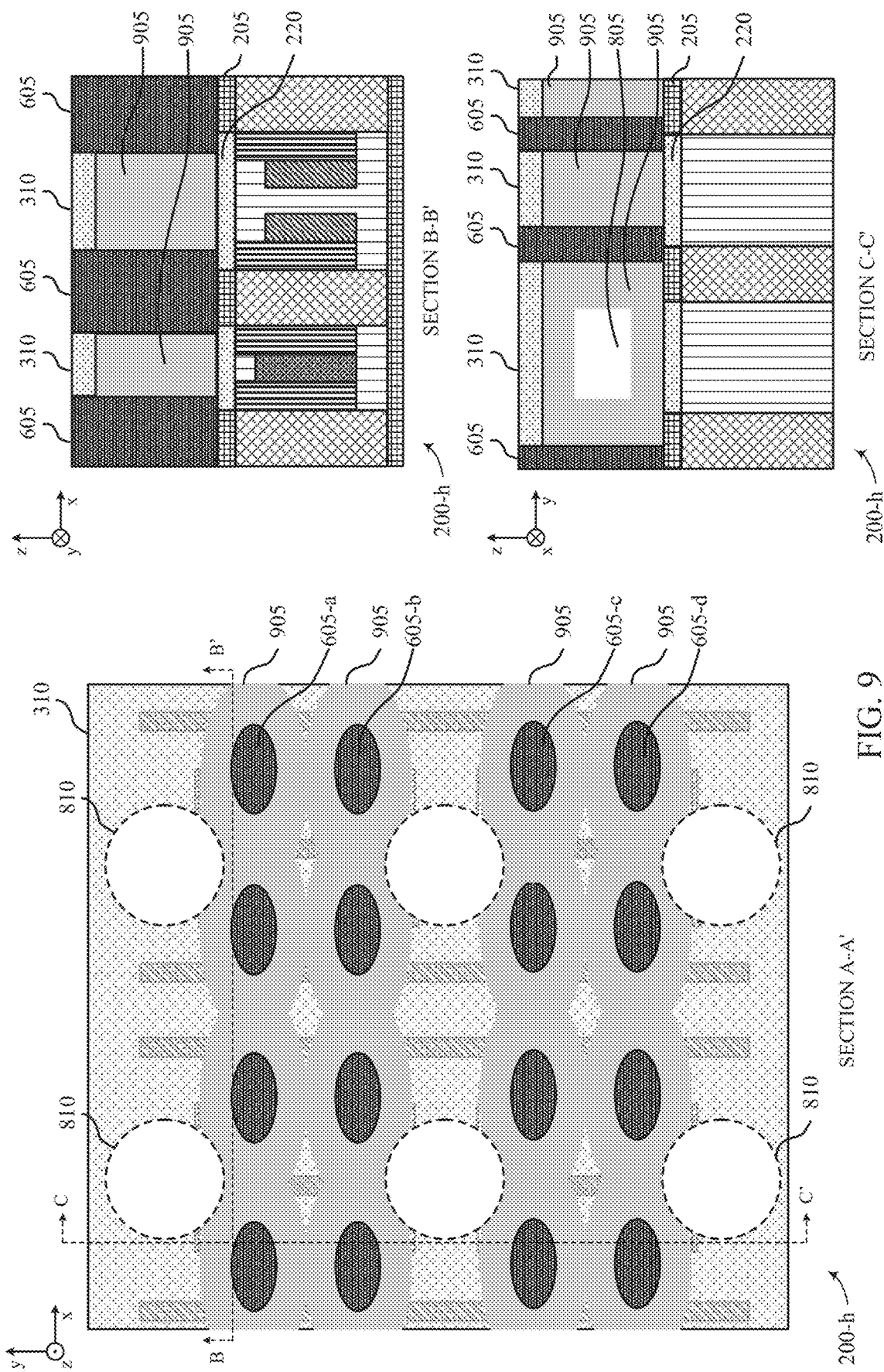

FIG. 9 illustrates the material arrangement 200 (e.g., as a material arrangement 200-h) after an eighth set of one or more manufacturing operations. The eighth set of manufacturing operations may include a deposition operation to deposit a dielectric material 905 via the holes 810 in the dielectric material 310. For example, the deposition operation may include an atomic layer deposition (ALD) to deposit a thin film of the dielectric material 905, which may be an oxide material. In some cases, the dielectric material 905 may be an example of a material used as part of a self-aligning technique. That is, the dielectric material 905 may conformally line the exposed surfaces of the material arrangement 200-g to form the material arrangement 200-h after the deposition operation. For example, the dielectric material 905 may conformally line sidewalls of the conductive pillars 605, a bottom surface of the dielectric material 310, a top surface of the dielectric material 220, and exposed surfaces of the contacts 205. In some cases, a depth of the dielectric material 905 (e.g., that is conformally lining exposed surfaces of the material arrangement 200-g) may be substantially uniform (e.g., 8 nanometers deep).

In some cases, the amount of the dielectric material 905 deposited as part of the eighth set of manufacturing operations may be insufficient to fill some cavities 805 formed in the seventh set of manufacturing operations. That is, the dielectric material 905 may partially fill the cavities 805 formed in the seventh set of manufacturing operations, but at least a portion of the cavities 805 may remain after the deposition of the dielectric material 905. For example, a first contiguous portion of the dielectric material 905 may conformally line the conductive pillars 605 in the first row and the second row (e.g., including the conductive pillar 605-*a* and the conductive pillar 605-*b*), but may not extend to fill the cavities 805 between conductive pillars 605 in the second row and the third row (e.g., including the conductive pillar 605-*c*). In some cases, the dielectric material 905 conformally lining the conductive pillars 605 in the first and second rows may be distinct from the dielectric material 905 conformally lining the conductive pillars 605 in the third and fourth rows. Alternatively, the dielectric material 905 lining the conductive pillars 605 in each of the rows in the material arrangement 200-*h* may be contiguous. For example, the dielectric material 905 may line a bottom surface of the dielectric material 310 and a top surface of the dielectric material 220 and a top surface of the contacts 205 between the second and third rows of the conductive pillars 605, but without filling the cavities 805 between the second and third rows of the conductive pillars 605.

Figure 10:
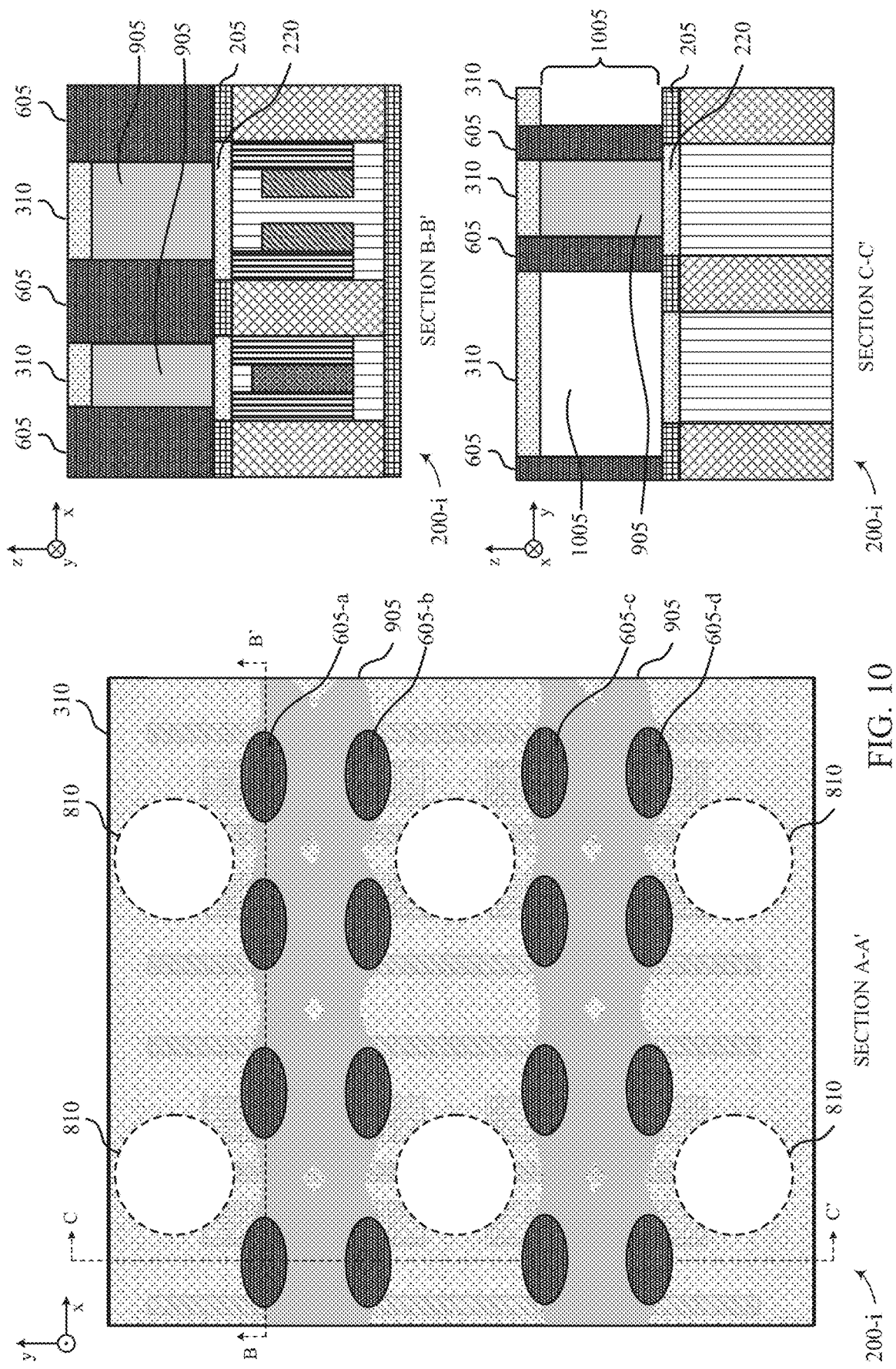

FIG. 10 illustrates the material arrangement 200 (e.g., as a material arrangement 200-*i*) after a ninth set of one or more manufacturing operations. The ninth set of manufacturing operations may form cavities 1005 based on removing portions of the dielectric material 905 from the material arrangement 200-*h* to form the material arrangement 200-*i*. In some cases, removing the dielectric material 905 may include performing an etch operation on the material arrangement 200-*h* that preferentially removes the dielectric material 905 (e.g., an isotropic etch operation). For example, the ninth set of manufacturing operations may include an isotropic etch operation where an etchant substance (e.g., that preferentially removes the dielectric material 905) is applied to the material arrangement 200-*i* via the holes 810 to remove portions of the dielectric material 905, thus forming the material arrangement 200-*i*. In some instances, the ninth set of manufacturing operations may remove a depth of the dielectric material 905 that is slightly greater than the depth of the dielectric material 905 deposited during the eighth set of manufacturing operations.

The ninth set of manufacturing operations may form the cavities 1005. The cavities 1005 may expose a portion of the surfaces of the conductive pillars 605 (e.g., a portion of the sidewalls of the conductive pillars 605). Additionally, portions of the bottom surface of the dielectric material 310 and top surfaces of the dielectric material 220 and a portion of the top surfaces of the contacts 205 may be exposed. The cavities 1005 may extend along the z-direction from a bottom surface of the dielectric material 310 to a top surface of the dielectric material 220 and a top surface of the contacts 205. Additionally, the cavities 1005 may extend along the y-direction from sidewalls of conductive pillars that are in rows that are spaced farther apart. For example, the dielectric material 905 may conformally line the sidewalls of the conductive pillars 605 that are between the first and second rows (e.g., including the conductive pillar 605-*a* and the conductive pillar 605-*b*, respectively) and the cavities 1005 may extend between the sidewalls of the conductive pillars 605 that are between the second and third rows (e.g., including the conductive pillar 605-*b* and the conductive pillar 605-*c*, respectively).

In some cases, after removing the portion of the dielectric material 905, the dielectric material 310 may contiguously surround each of the conductive pillars 605. Additionally, the contiguous dielectric material 310 above the cavities 1005 may increase a mechanical stability of the material arrangement 200-*i*. That is, the dielectric material 310 may prevent the conductive pillars 605 from buckling after removing the dielectric material 905 to form the cavities 1005.

Figure 11:
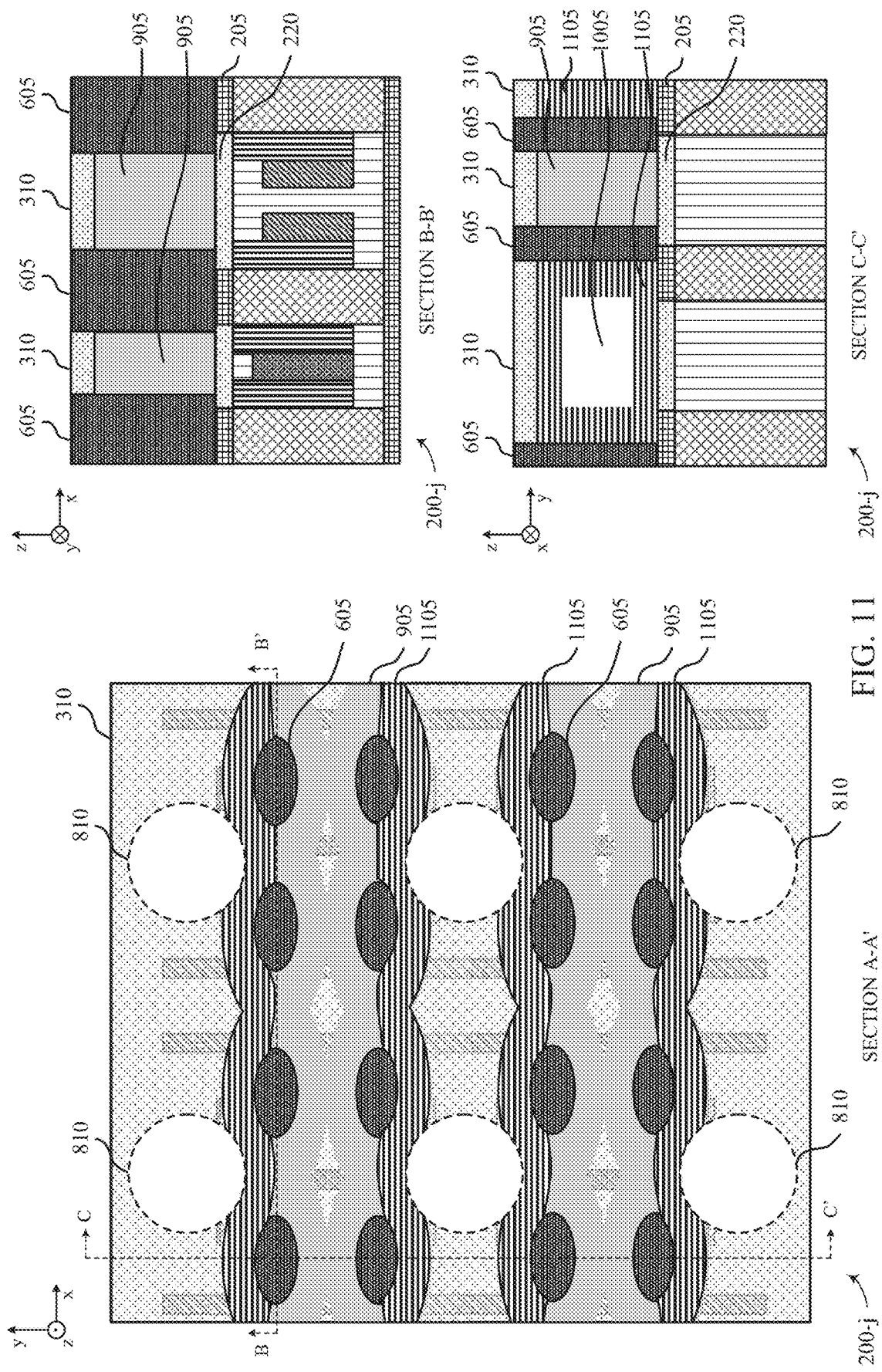

FIG. 11 illustrates the material arrangement 200 (e.g., as a material arrangement 200-*j*) after a tenth set of one or more manufacturing operations. The tenth set of manufacturing operations may include a deposition operation to deposit a ferroelectric material 1105 via the holes 810 in the dielectric material 310. For example, the deposition operation may include an ALD to deposit a thin film of the ferroelectric material 1105. In the example of the material arrangement 200-*j*, the tenth set of manufacturing operations includes the deposition operation to deposit the ferroelectric material 115, but in other examples, the tenth set of manufacturing operations may instead include a deposition operation to deposit a dielectric material (e.g., in examples associated with manufacturing a memory device comprising DRAM). In some examples, the ferroelectric material 1105 may instead be a dielectric material. In some cases, the ferroelectric material 1105 may be an example of a material used as part of a self-aligning technique. That is, the ferroelectric material 1105 may conformally line the exposed surfaces of the material arrangement 200-*i* to form the material arrangement 200-*j* after the deposition operation. For example, the ferroelectric material 1105 may conformally line the exposed portions of the conductive pillars 605, the exposed portions of the bottom surface of the dielectric material 310, the exposed portions of the top surface of the dielectric material 220, and the exposed portions of the contacts 205. Additionally, the ferroelectric material 1105 may be coupled with the dielectric material 905 (e.g., the sidewalls of the ferroelectric material 1105 may be coupled with the sidewalls of the dielectric material 905). In some cases, a depth of the ferroelectric material 1105 (e.g., that is conformally lining exposed surfaces of the material arrangement 200-*j*) may be substantially uniform.

After performing the deposition operation to form the material arrangement 200-*j*, a first portion of the sidewalls of the conductive pillars may be coupled with the dielectric material 905 while a remaining portion of the sidewalls of the conductive pillars may be coupled with the ferroelectric material 1105. In some cases, the amount of the ferroelectric material 1105 deposited as part of the tenth set of manufacturing operations may be insufficient to fill the cavities 1005 formed in the ninth set of manufacturing operations. That is, the ferroelectric material 1105 may partially fill the cavities 1005 formed in the ninth set of manufacturing operations, but at least a portion of the cavities 1005 may remain after the deposition of the ferroelectric material 1105. In some cases, the ferroelectric material 1105 may line a bottom surface of the dielectric material 310 and a top surface of the dielectric material 220 between the second and third rows of the conductive pillars 605, but without filling the cavities 1005 between the second and third rows of the conductive pillars 605.

Figure 12:
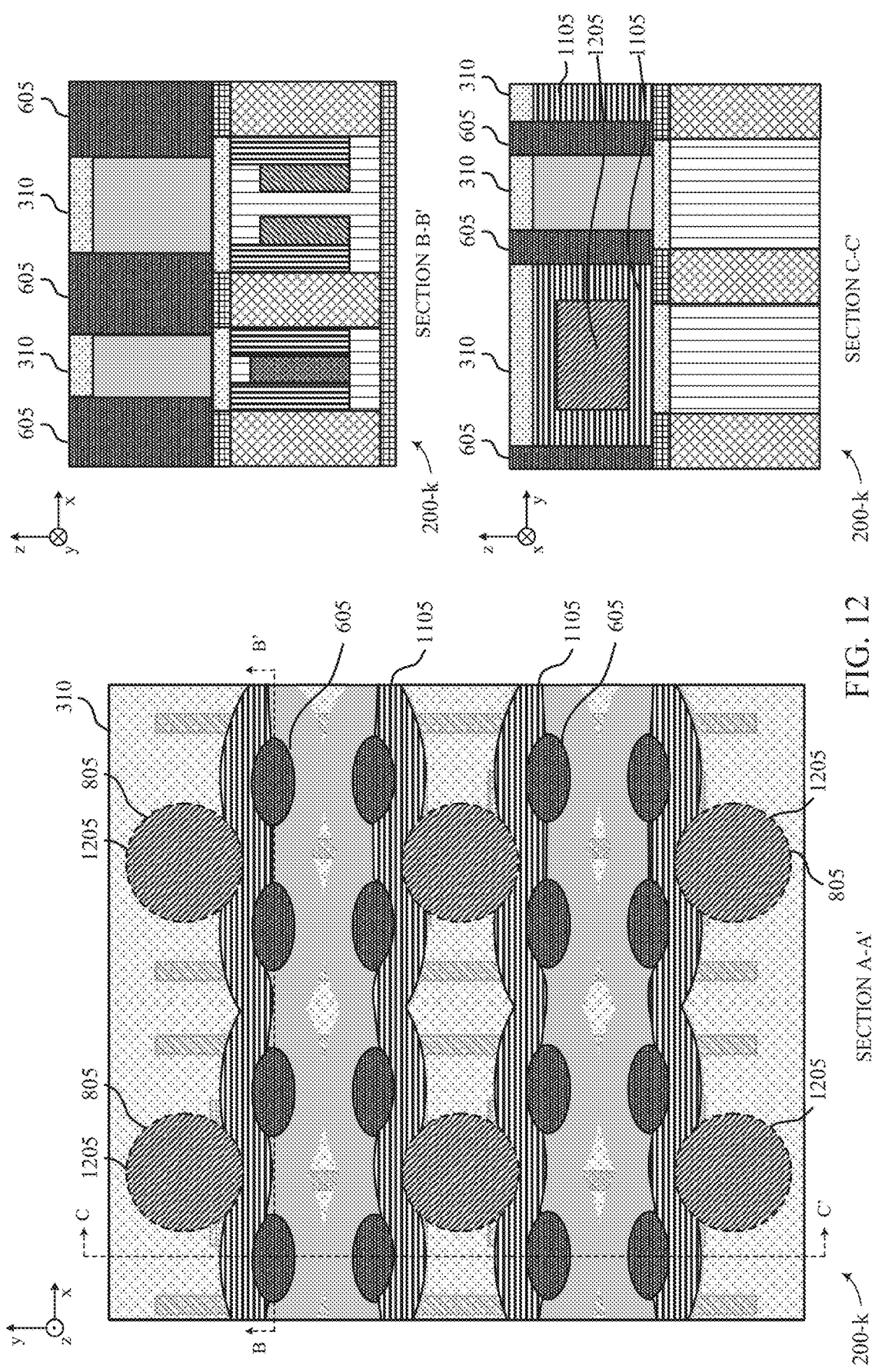

FIG. 12 illustrates the material arrangement 200 (e.g., as a material arrangement 200-*k*) after an eleventh set of one or more manufacturing operations. The ninth set of manufacturing operations may include a deposition of a conductive material 1205 via the holes 810 in the dielectric material 310. The conductive material 1205 may fill the cavities 1005 in the material arrangement 200-*j* to form the material arrangement 200-*k*. That is, the conductive material may be coupled with the exposed surfaces of the ferroelectric material 1105 (e.g., the surfaces of the ferroelectric material 1105 that are exposed in the material arrangement 200-*j*).

Figure 13:
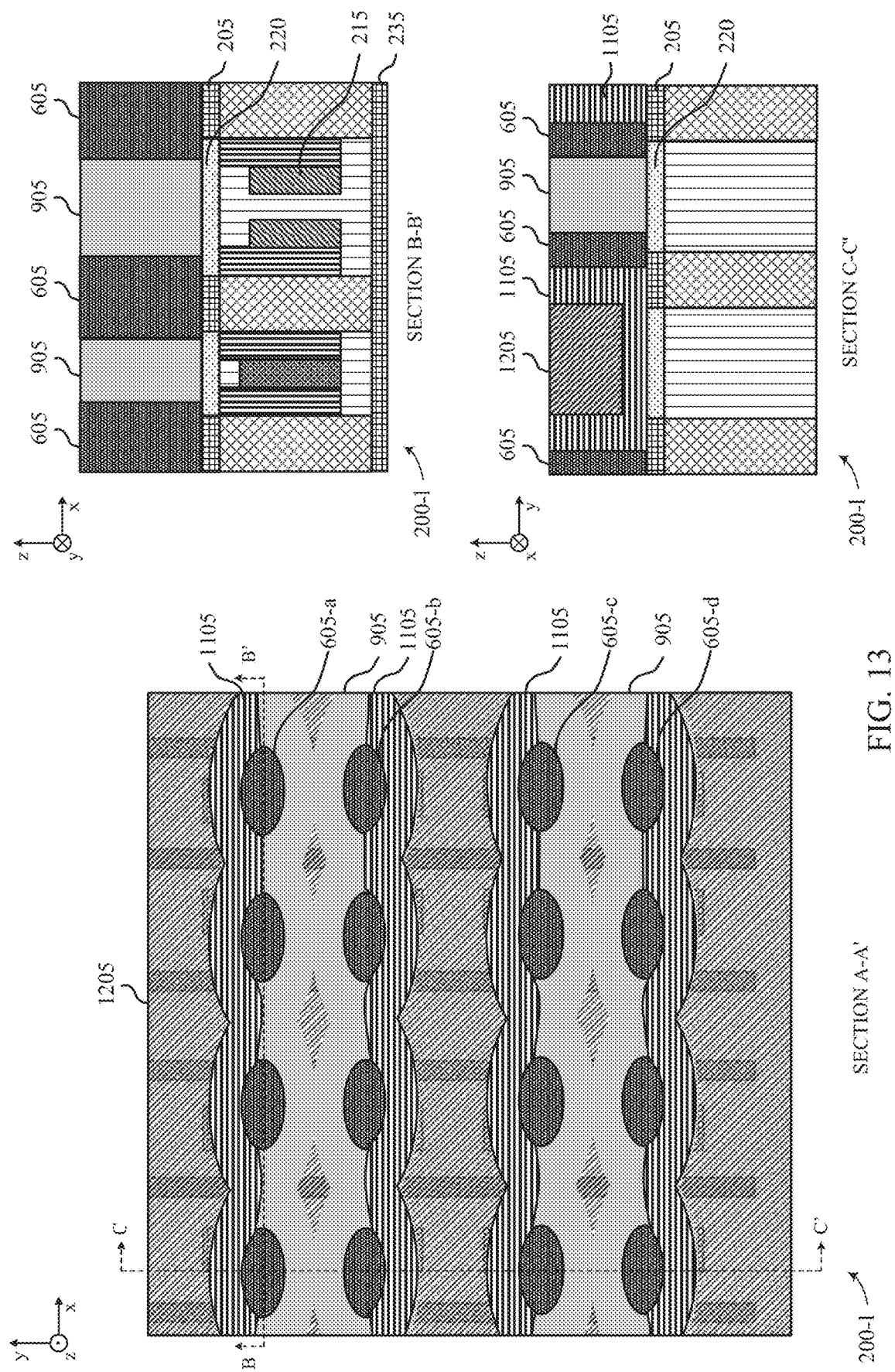

FIG. 13 illustrates the material arrangement 200 (e.g., as a material arrangement 200-*l*) after a twelfth set of one or more manufacturing operations. The twelfth set of manufacturing operations may include an etching operation to remove a top portion of the material arrangement 200-*k* to form the material arrangement 200-*l*. For example, the etching operation may remove the dielectric material 310 from the material arrangement 200-*k*. Additionally, the etching operation may remove a top portion of the conductive pillars 605 to form the conductive pillars 605 in the material arrangement 200-*l* that are shorter than the conductive pillars 605 in the material arrangement 200-*k*. Additionally, the etching operation may remove a top portion of the conductive material 1205 from the material arrangement 200-*k* to form the material arrangement 200-*l*.

In some cases, the twelfth set of manufacturing operations may support forming plate lines (e.g., the plate lines 120 as described with reference to FIG. 1). For example, the conductive material 1205 that is coupled with the ferroelectric material 1105 coupled with the sidewalls of the conductive pillars 605 in the first row (e.g., including the conductive pillar 605-*a*) may correspond to a plate line associated with the first row of conductive pillars 605. Additionally, the conductive material 1205 that is coupled with the ferroelectric material 1105 coupled with the sidewalls of the conductive pillars 605 in the second row (e.g., including the conductive pillar 605-*b*) and the ferroelectric material 1105 coupled with the sidewalls of the conductive pillars 605 in the third row (e.g., including the conductive pillar 605-*c*) may correspond to a plate line associated with the second and third rows of conductive pillars 605. In the example of the material arrangement 200-*l*, the plate lines may extend along the substrate in the x-direction, which may be orthogonal to the word lines 215 (e.g., which extend along the substrate in the y-direction).

The twelfth set of manufacturing operations may additionally support forming capacitors (e.g., the capacitors 140 as described with reference to FIG. 1). For example, each conductive pillar 605 may correspond to a first electrode of the capacitor (e.g., a bottom electrode of the capacitor) and the plate line may correspond to a second electrode of multiple capacitors (e.g., a top electrode of the capacitors). Additionally, each conductive pillar 605 may be coupled with the plate line (e.g., the conductive material 1205) via the ferroelectric material 1105, which may form a ferroelectric capacitor. In some other examples (e.g., where the ferroelectric material 1105 is instead a dielectric material such as in DRAM devices), each conductive pillar 605 may be coupled with the plate line via the dielectric material, which may form a dielectric capacitor. Thus, each row of conductive pillars 605 may correspond to a row of ferroelectric capacitors (each having one electrode associated with the plate line corresponding to the conductive material 1205). Here, each of the capacitors may additionally be associated with one of the contacts 205 (e.g., based on the conductive pillar 605 associated with the capacitor being coupled with a contact 205). Thus, each of the capacitors may be coupled with a word line 215 and a digit line 235. Additionally, the ferroelectric material 1105 being used as part of a self-aligning technique may decrease a variability in a thickness of each capacitor (e.g., as compared to capacitors including a ferroelectric material that is not self-aligning).

Figure 14:
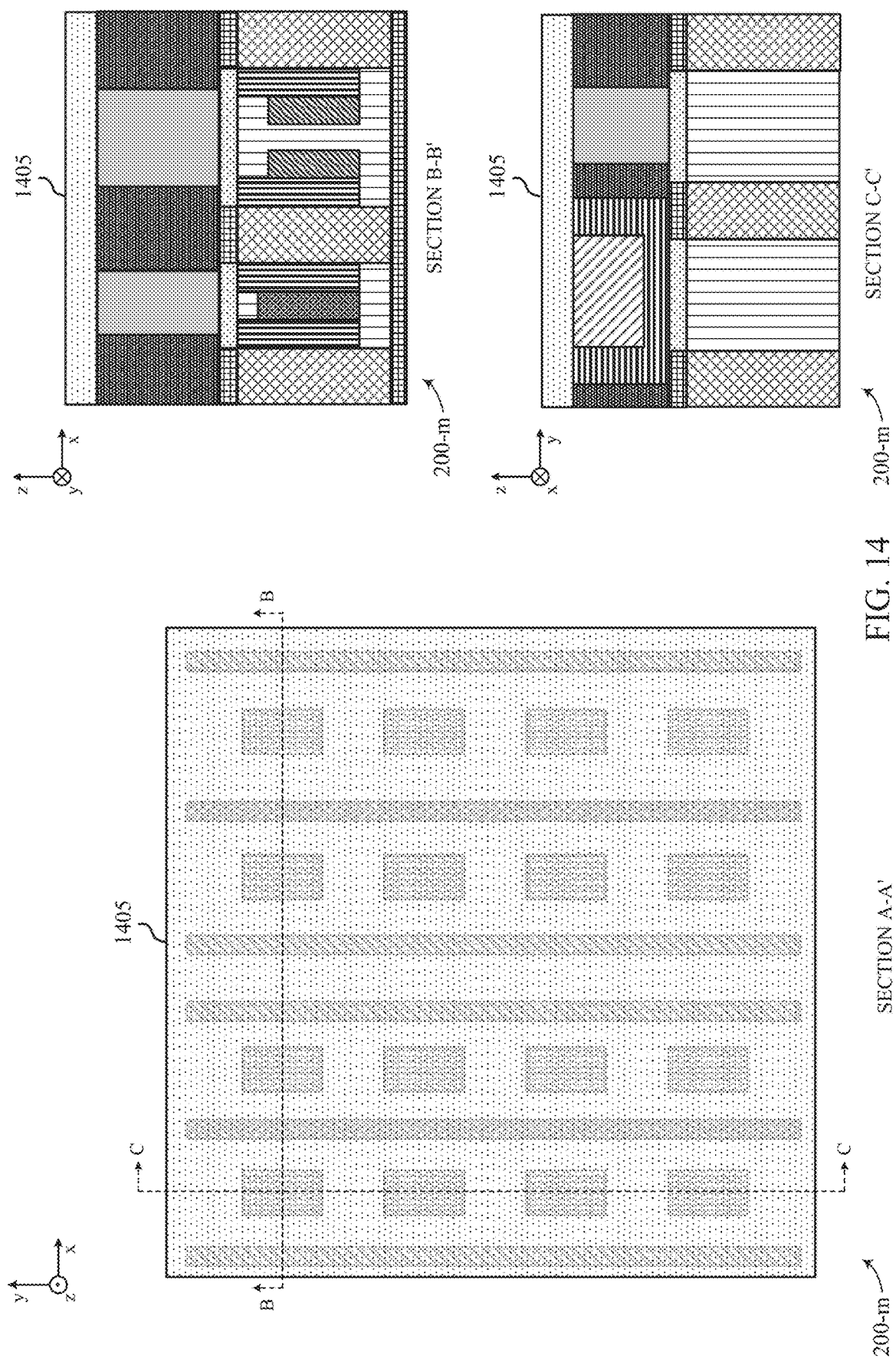

FIG. 14 illustrates the material arrangement 200 (e.g., as a material arrangement 200-*m*) after a thirteenth set of one or more manufacturing operations. In some examples, forming the material arrangement 200-*m* may include performing a deposition operation to deposit a dielectric material 1405 over the material arrangement 200-*l*. In some cases (although not illustrated in FIG. 14), the material arrangement 200-*m* may include one or more additional dielectric materials deposited after the dielectric material 1405 over the material arrangement 200-*l*.

Figure 15:
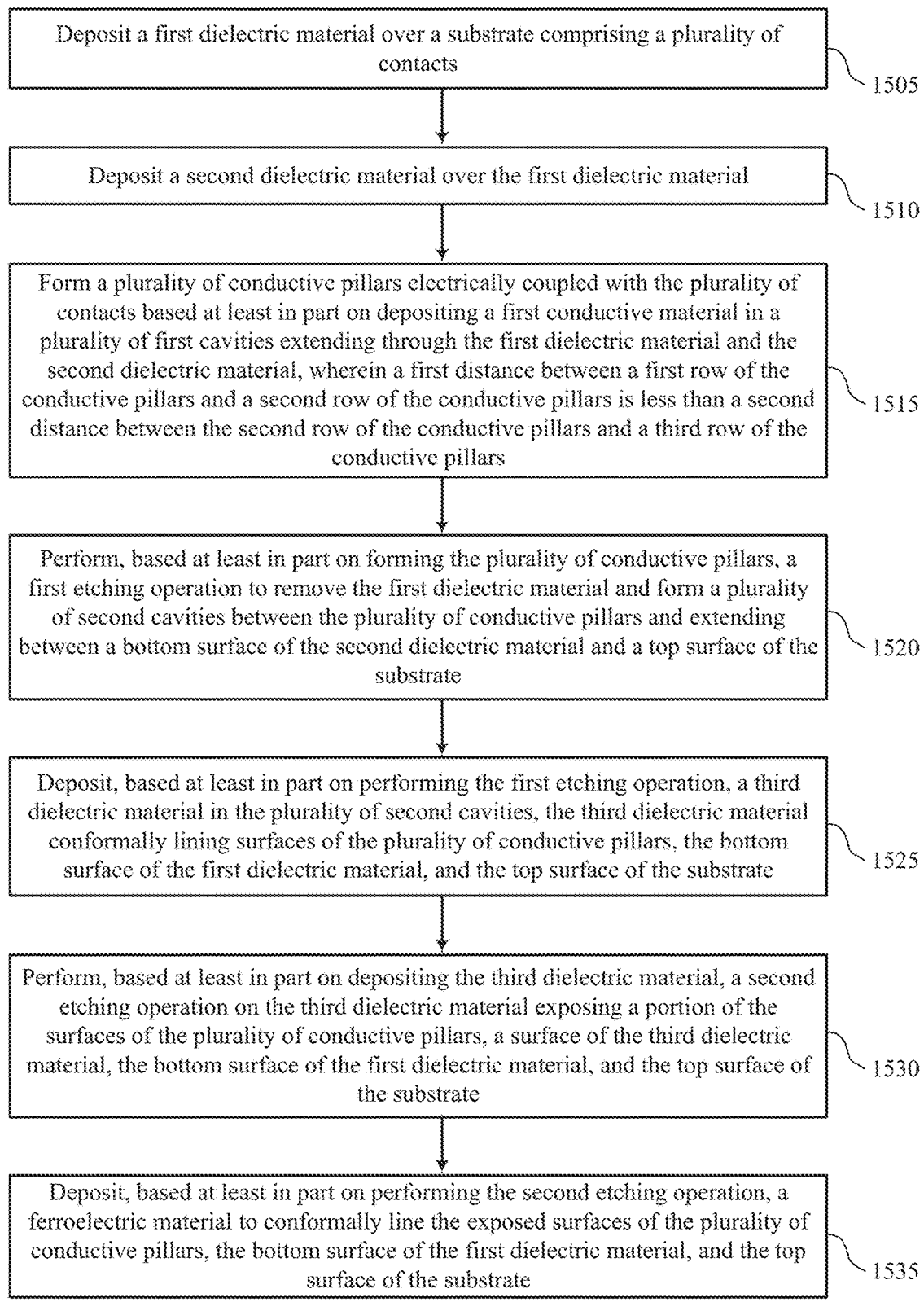
FIGS. 15 and 16 show flowcharts illustrating a method or methods that support formation for memory cells in accordance with examples as disclosed herein.

FIG. 15 shows a flowchart illustrating a method 1500 that supports formation for memory cells in accordance with examples as disclosed herein. The operations of method 1500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1505, the method 1500 may include depositing a first dielectric material over a substrate including a plurality of contacts. The operations of 1505 may be performed in accordance with examples as disclosed herein.

At 1510, the method 1500 may include depositing a second dielectric material over the first dielectric material. The operations of 1510 may be performed in accordance with examples as disclosed herein.

At 1515, the method 1500 may include forming a plurality of conductive pillars electrically coupled with the plurality of contacts based at least in part on depositing a first conductive material in a plurality of first cavities extending through the first dielectric material and the second dielectric material, where a first distance between a first row of the conductive pillars and a second row of the conductive pillars is less than a second distance between the second row of the conductive pillars and a third row of the conductive pillars. The operations of 1515 may be performed in accordance with examples as disclosed herein.

At 1520, the method 1500 may include performing, based at least in part on forming the plurality of conductive pillars, a first etching operation to remove the first dielectric material and form a plurality of second cavities between the plurality of conductive pillars and extending between a bottom surface of the second dielectric material and a top surface of the substrate. The operations of 1520 may be performed in accordance with examples as disclosed herein.

At 1525, the method 1500 may include depositing, based at least in part on performing the first etching operation, a third dielectric material in the plurality of second cavities, the third dielectric material conformally lining surfaces of the plurality of conductive pillars, the bottom surface of the first dielectric material, and the top surface of the substrate. The operations of 1525 may be performed in accordance with examples as disclosed herein.

At 1530, the method 1500 may include performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate. The operations of 1530 may be performed in accordance with examples as disclosed herein.

At 1535, the method 1500 may include depositing, based at least in part on performing the second etching operation, a ferroelectric material to conformally line the exposed surfaces of the plurality of conductive pillars, the bottom surface of the first dielectric material, and the top surface of the substrate. The operations of 1535 may be performed in accordance with examples as disclosed herein.

In some examples, an apparatus (e.g., a manufacturing system) as described herein may perform a method or methods, such as the method 1500. The apparatus may include features, circuitry, logic, means, or instructions (e.g., a non-transitory computer-readable medium storing instructions executable by a processor), or any combination thereof for performing the following aspects of the present disclosure:

Aspect 1: A method or apparatus including operations, features, circuitry, logic, means, or instructions, or any combination thereof for depositing a first dielectric material over a substrate including a plurality of contacts; depositing a second dielectric material over the first dielectric material; forming a plurality of conductive pillars electrically coupled with the plurality of contacts based at least in part on depositing a first conductive material in a plurality of first cavities extending through the first dielectric material and the second dielectric material, where a first distance between a first row of the conductive pillars and a second row of the conductive pillars is less than a second distance between the second row of the conductive pillars and a third row of the conductive pillars; performing, based at least in part on forming the plurality of conductive pillars, a first etching operation to remove the first dielectric material and form a plurality of second cavities between the plurality of conductive pillars and extending between a bottom surface of the second dielectric material and a top surface of the substrate; depositing, based at least in part on performing the first etching operation, a third dielectric material in the plurality of second cavities, the third dielectric material conformally lining surfaces of the plurality of conductive pillars, the bottom surface of the first dielectric material, and the top surface of the substrate; performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate; and depositing, based at least in part on performing the second etching operation, a ferroelectric material to conformally line the exposed surfaces of the plurality of conductive pillars, the bottom surface of the first dielectric material, and the top surface of the substrate.

Aspect 2: The method or apparatus of aspect 1, further including operations, features, circuitry, logic, means, or instructions, or any combination thereof for performing, based at least in part on depositing the second dielectric material, a third etching operation to form the plurality of first cavities extending through the first dielectric material and the second dielectric material and exposing at least a portion of each of the plurality of contacts, where forming the plurality of conductive pillars is based at least in part performing the third etching operation.

Aspect 3: The method or apparatus of aspect 2 where the first distance between a first row of the first cavities and a second row of the first cavities is less than the second distance between the second row of the first cavities and a third row of the first cavities.

Aspect 4: The method or apparatus of any of aspects 2 through 3, further including operations, features, circuitry, logic, means, or instructions, or any combination thereof for depositing a mask after depositing the second dielectric material, where performing the third etching operation is based at least in part on depositing the mask.

Aspect 5: The method or apparatus of any of aspects 1 through 4 where the third dielectric material self-aligns to conformally line the surfaces of the plurality of conductive pillars, the bottom surface of the first dielectric material, and the top surface with a substantially uniform depth of the third dielectric material.

Aspect 6: The method or apparatus of any of aspects 1 through 5, further including operations, features, circuitry, logic, means, or instructions, or any combination thereof for performing, based at least in part on forming the plurality of conductive pillars, a fourth etching operation to form a plurality of fourth cavities between the second row of the conductive pillars and the third row of the conductive pillars, the plurality of fourth cavities extending through the second dielectric material and exposing a top surface of the first dielectric material, where performing the first etching operation is based at least in part on performing the fourth etching operation.

Aspect 7: The method or apparatus of aspect 6 where the third dielectric material is deposited in the plurality of second cavities via the plurality of fourth cavities and the ferroelectric material is deposited via the plurality of fourth cavities.

Aspect 8: The method or apparatus of any of aspects 6 through 7 where the first etching operation to remove the first dielectric material is performed via the plurality of fourth cavities and the second etching operation to expose the portion of the surfaces of the plurality of conductive pillars is performed via the plurality of fourth cavities.

Aspect 9: The method or apparatus of any of aspects 6 through 8 where the second dielectric material contiguously surrounds each of the plurality of fourth cavities after performing the fourth etching operation.

Aspect 10: The method or apparatus of any of aspects 1 through 9 where after depositing the ferroelectric material, a first contiguous portion of the third dielectric material lines a second portion of the surfaces of the conductive pillars in the first row and the conductive pillars in the second row and a second contiguous portion of the third dielectric material distinct from the first contiguous portion of the third dielectric material lines a second portion of the surfaces of the conductive pillars in the third row.

Aspect 11: The method or apparatus of aspect 10 where after depositing the ferroelectric material, a first portion of the ferroelectric material lines the portion of the surfaces of the conductive pillars in the first row and the conductive pillars in the second row and is coupled with first contiguous portion of the third dielectric material and after depositing the ferroelectric material, a second portion of the ferroelectric material distinct from the first portion of the ferroelectric material lines the portion of the surfaces of the conductive pillars in the third row and is coupled with the second contiguous portion of the third dielectric material.

Aspect 12: The method or apparatus of any of aspects 1 through 11, further including operations, features, circuitry, logic, means, or instructions, or any combination thereof for depositing, based at least in part depositing the ferroelectric material, a second conductive material to fill remaining portions of the second cavities, the second conductive material coupled with the ferroelectric material and isolated from the plurality of conductive pillars and the third dielectric material by the ferroelectric material.

Aspect 13: The method or apparatus of aspect 12 where the second conductive material extends from a first portion of the ferroelectric material conformally lining surfaces of the conductive pillars in the second row to a second portion of the ferroelectric material conformally lining surfaces of the conductive pillars in the third row.

Aspect 14: The method or apparatus of any of aspects 12 through 13, further including operations, features, circuitry, logic, means, or instructions, or any combination thereof for performing a fifth etching operation after depositing the ferroelectric material to remove the first dielectric material and portions of the ferroelectric material lining the bottom surface of the first dielectric material, the fifth etching operation exposing surface of the plurality of conductive pillars, a surface of the third dielectric material, a surface of the ferroelectric material, and a surface of the second conductive material.

Aspect 15: The method or apparatus of aspect 14 where the plurality of contacts are electrically coupled with digit lines via first surfaces of the plurality of contacts that are opposite second surfaces of the plurality of contacts that are electrically with the plurality of conductive pillars.

Aspect 16: The method or apparatus of any of aspects 14 through 15 where the plurality of contacts are electrically coupled with word lines via first surfaces of the plurality of contacts that are adjacent to second surfaces of the plurality of contacts that are electrically coupled with the plurality of conductive pillars.

Aspect 17: The method or apparatus of any of aspects 12 through 16 where the second conductive material is associated with a plate line.

Figure 16:
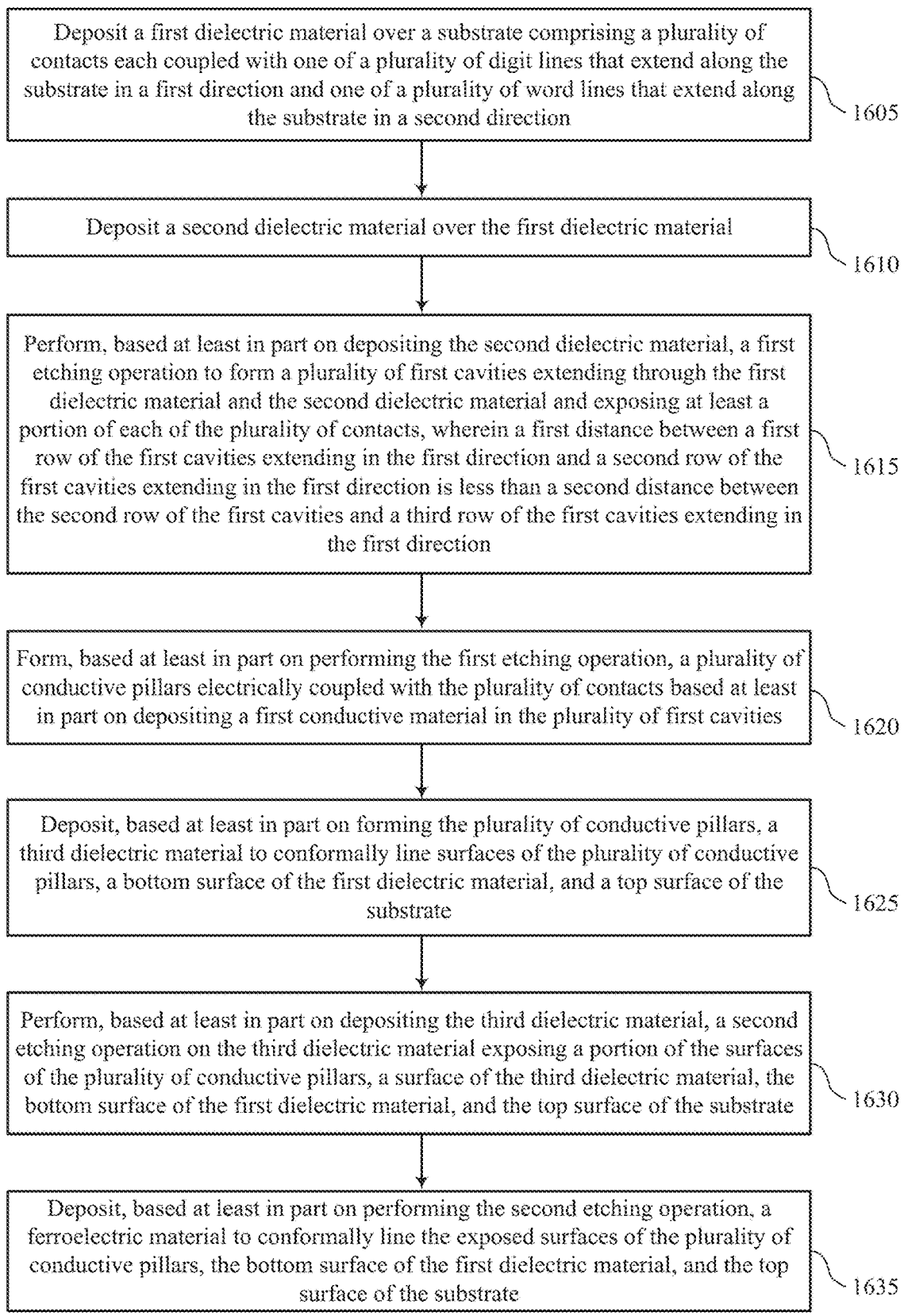

FIG. 16 shows a flowchart illustrating a method 1600 that supports formation for memory cells in accordance with examples as disclosed herein. The operations of method 1600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1605, the method may include depositing a first dielectric material over a substrate including a plurality of contacts each coupled with one of a plurality of digit lines that extend along the substrate in a first direction and one of a plurality of word lines that extend along the substrate in a second direction. The operations of 1605 may be performed in accordance with examples as disclosed herein.

At 1610, the method may include depositing a second dielectric material over the first dielectric material. The operations of 1610 may be performed in accordance with examples as disclosed herein.

At 1615, the method may include performing, based at least in part on depositing the second dielectric material, a first etching operation to form a plurality of first cavities extending through the first dielectric material and the second dielectric material and exposing at least a portion of each of the plurality of contacts, where a first distance between a first row of the first cavities extending in the first direction and a second row of the first cavities extending in the first direction is less than a second distance between the second row of the first cavities and a third row of the first cavities extending in the first direction. The operations of 1615 may be performed in accordance with examples as disclosed herein.

At 1620, the method may include forming, based at least in part on performing the first etching operation, a plurality of conductive pillars electrically coupled with the plurality of contacts based at least in part on depositing a first conductive material in the plurality of first cavities. The operations of 1620 may be performed in accordance with examples as disclosed herein.

At 1625, the method may include depositing, based at least in part on forming the plurality of conductive pillars, a third dielectric material to conformally line surfaces of the plurality of conductive pillars, a bottom surface of the first dielectric material, and a top surface of the substrate. The operations of 1625 may be performed in accordance with examples as disclosed herein.

At 1630, the method may include performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate. The operations of 1630 may be performed in accordance with examples as disclosed herein.

At 1635, the method may include depositing, based at least in part on performing the second etching operation, a ferroelectric material to conformally line the exposed surfaces of the plurality of conductive pillars, the bottom surface of the first dielectric material, and the top surface of the substrate. The operations of 1635 may be performed in accordance with examples as disclosed herein.

In some examples, an apparatus (e.g., a manufacturing system) as described herein may perform a method or methods, such as the method 1600. The apparatus may include features, circuitry, logic, means, or instructions (e.g., a non-transitory computer-readable medium storing instructions executable by a processor), or any combination thereof for performing the following aspects of the present disclosure:

Aspect 18: A method or apparatus including operations, features, circuitry, logic, means, or instructions, or any combination thereof for depositing a first dielectric material over a substrate including a plurality of contacts each coupled with one of a plurality of digit lines that extend along the substrate in a first direction and one of a plurality of word lines that extend along the substrate in a second direction; depositing a second dielectric material over the first dielectric material; performing, based at least in part on depositing the second dielectric material, a first etching operation to form a plurality of first cavities extending through the first dielectric material and the second dielectric material and exposing at least a portion of each of the plurality of contacts, where a first distance between a first row of the first cavities extending in the first direction and a second row of the first cavities extending in the first direction is less than a second distance between the second row of the first cavities and a third row of the first cavities extending in the first direction; forming, based at least in part on performing the first etching operation, a plurality of conductive pillars electrically coupled with the plurality of contacts based at least in part on depositing a first conductive material in the plurality of first cavities; depositing, based at least in part on forming the plurality of conductive pillars, a third dielectric material to conformally line surfaces of the plurality of conductive pillars, a bottom surface of the first dielectric material, and a top surface of the substrate; performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate; and depositing, based at least in part on performing the second etching operation, a ferroelectric material to conformally line the exposed surfaces of the plurality of conductive pillars, the bottom surface of the first dielectric material, and the top surface of the substrate.

Aspect 19: The method or apparatus of any of aspects 18, further including operations, features, circuitry, logic, means, or instructions, or any combination thereof for depositing a mask over the second dielectric material, where performing the first etching operation is based at least in part on depositing the mask and the first distance is less than the second distance based at least in part on depositing the mask.

Aspect 20: The method or apparatus of aspect 18, further including operations, features, circuitry, logic, means, or instructions, or any combination thereof for performing, based at least in part on forming the plurality of conductive pillars, a third etching operation to remove the first dielectric material and form a plurality of second cavities between the plurality of conductive pillars and extending between a bottom surface of the second dielectric material and a top surface of the substrate, where depositing the third dielectric material is based at least in part on forming the plurality of second cavities.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 21: An apparatus, including: a substrate including a plurality of contacts electrically coupled with one of a plurality of digit lines extending along the substrate in a first direction and one of plurality of word lines extending along the substrate in a second direction; a plurality of conductive pillars electrically coupled with the plurality of contacts, where a first distance between a first row of the conductive pillars extending in the first direction and a second row of the conductive pillars extending in the first direction is less than a second distance between the second row of the conductive pillars and a third row of the conductive pillars extending in the first direction; a first dielectric material between the first row of the conductive pillars and the second row of the conductive pillars electrically coupled with a first portion of surfaces of the plurality of conductive pillars; a second dielectric material corresponding to a plurality of memory cells, the second dielectric material conformally lining a second portion of the surfaces of the plurality of conductive pillars that is between the second row of the conductive pillars and the third row of the conductive pillars; and a conductive material corresponding to a plate line extending in the first direction, the conductive material between the second row of the conductive pillars and the third row of the conductive pillars and electrically coupled with the second dielectric material.

Aspect 22: The apparatus of aspect 21, where the apparatus includes a plurality of capacitors, each capacitor including: a first electrode corresponding to one of the plurality of conductive pillars; a ferroelectric material corresponding to the second dielectric material; and a second electrode corresponding to the conductive material.

Aspect 23: The apparatus of any of aspects 21 through 22, where the second dielectric material is used as part of a self-aligning process.

Aspect 24: The apparatus of any of aspects 21 through 23, where the second dielectric material is electrically coupled with the plurality of contacts.

Aspect 25: The apparatus of any of aspects 21 through 24, where first dielectric material electrically isolates the conductive pillars in the first row from the conductive pillars in the second row.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal, however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   depositing a first dielectric material over a substrate comprising a plurality of contacts;
   depositing a second dielectric material over the first dielectric material;
   forming a plurality of conductive pillars electrically coupled with the plurality of contacts based at least in part on depositing a first conductive material in a plurality of first cavities extending through the first dielectric material and the second dielectric material, wherein a first distance between a first row of the conductive pillars and a second row of the conductive pillars is less than a second distance between the second row of the conductive pillars and a third row of the conductive pillars;
   performing, based at least in part on forming the plurality of conductive pillars, a first etching operation to remove the first dielectric material and form a plurality of second cavities between the plurality of conductive pillars and extending between a bottom surface of the second dielectric material and a top surface of the substrate;
   depositing, based at least in part on performing the first etching operation, a third dielectric material in the plurality of second cavities, the third dielectric material conformally lining surfaces of the plurality of conductive pillars, the bottom surface of the first dielectric material, and the top surface of the substrate;
   performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate; and
   depositing, based at least in part on performing the second etching operation, a ferroelectric material to conformally line the exposed surfaces of the plurality of conductive pillars, the bottom surface of the first dielectric material, and the top surface of the substrate.

2. The method of claim 1, further comprising:
   performing, based at least in part on depositing the second dielectric material, a third etching operation to form the plurality of first cavities extending through the first dielectric material and the second dielectric material and exposing at least a portion of each of the plurality of contacts, wherein forming the plurality of conductive pillars is based at least in part performing the third etching operation.

3. The method of claim 2, wherein the first distance between a first row of the first cavities and a second row of the first cavities is less than the second distance between the second row of the first cavities and a third row of the first cavities.

4. The method of claim 2, further comprising:
   depositing a mask after depositing the second dielectric material, wherein performing the third etching operation is based at least in part on depositing the mask.

5. The method of claim 1, wherein the third dielectric material self-aligns to conformally line the surfaces of the plurality of conductive pillars, the bottom surface of the first dielectric material, and the top surface with a substantially uniform depth of the third dielectric material.

6. The method of claim 1, further comprising:
   performing, based at least in part on forming the plurality of conductive pillars, a fourth etching operation to form a plurality of fourth cavities between the second row of the conductive pillars and the third row of the conductive pillars, the plurality of fourth cavities extending through the second dielectric material and exposing a top surface of the first dielectric material, wherein performing the first etching operation is based at least in part on performing the fourth etching operation.

7. The method of claim 6, wherein:
   the third dielectric material is deposited in the plurality of second cavities via the plurality of fourth cavities; and
   the ferroelectric material is deposited via the plurality of fourth cavities.

8. The method of claim 6, wherein:
   the first etching operation to remove the first dielectric material is performed via the plurality of fourth cavities; and
   the second etching operation to expose the portion of the surfaces of the plurality of conductive pillars is performed via the plurality of fourth cavities.

9. The method of claim 6, wherein the second dielectric material contiguously surrounds each of the plurality of fourth cavities after performing the fourth etching operation.

10. The method of claim 1, wherein:
    after depositing the ferroelectric material, a first contiguous portion of the third dielectric material lines a second portion of the surfaces of the conductive pillars in the first row and the conductive pillars in the second row; and
    a second contiguous portion of the third dielectric material distinct from the first contiguous portion of the third dielectric material lines a second portion of the surfaces of the conductive pillars in the third row.

11. The method of claim 10, wherein:
    after depositing the ferroelectric material, a first portion of the ferroelectric material lines the portion of the surfaces of the conductive pillars in the first row and the conductive pillars in the second row and is coupled with the first contiguous portion of the third dielectric material; and
    after depositing the ferroelectric material, a second portion of the ferroelectric material distinct from the first portion of the ferroelectric material lines the portion of the surfaces of the conductive pillars in the third row and is coupled with the second contiguous portion of the third dielectric material.

12. The method of claim 1, further comprising:
    depositing, based at least in part depositing the ferroelectric material, a second conductive material to fill remaining portions of the second cavities, the second conductive material coupled with the ferroelectric material and isolated from the plurality of conductive pillars and the third dielectric material by the ferroelectric material.

13. The method of claim 12, further comprising:
performing a fifth etching operation after depositing the ferroelectric material to remove the first dielectric material and portions of the ferroelectric material lining the bottom surface of the first dielectric material, the fifth etching operation exposing a surface of the plurality of conductive pillars, a surface of the third dielectric material, a surface of the ferroelectric material, and a surface of the second conductive material.

14. An apparatus, comprising:
a substrate comprising a plurality of contacts electrically coupled with one of a plurality of digit lines extending along the substrate in a first direction and one of plurality of word lines extending along the substrate in a second direction;
a plurality of conductive pillars electrically coupled with the plurality of contacts, wherein a first distance between a first row of the conductive pillars extending in the first direction and a second row of the conductive pillars extending in the first direction is less than a second distance between the second row of the conductive pillars and a third row of the conductive pillars extending in the first direction;
a first dielectric material between the first row of the conductive pillars and the second row of the conductive pillars electrically coupled with a first portion of surfaces of the plurality of conductive pillars;
a second dielectric material corresponding to a plurality of memory cells, the second dielectric material conformally lining a second portion of the surfaces of the plurality of conductive pillars that is between the second row of the conductive pillars and the third row of the conductive pillars; and
a conductive material corresponding to a plate line extending in the first direction, the conductive material between the second row of the conductive pillars and the third row of the conductive pillars and electrically coupled with the second dielectric material.

15. The apparatus of claim 14, wherein the apparatus comprises a plurality of capacitors, each capacitor comprising:
a first electrode corresponding to one of the plurality of conductive pillars;
a ferroelectric material corresponding to the second dielectric material; and
a second electrode corresponding to the conductive material.

16. The apparatus of claim 14, wherein:
the second dielectric material is used as part of a self-aligning process; and
the second dielectric material is electrically coupled with the plurality of contacts.

17. The apparatus of claim 14, wherein first dielectric material electrically isolates the conductive pillars in the first row from the conductive pillars in the second row.

18. A method, comprising:
depositing a first dielectric material over a substrate comprising a plurality of contacts each coupled with one of a plurality of digit lines that extend along the substrate in a first direction and one of a plurality of word lines that extend along the substrate in a second direction;
depositing a second dielectric material over the first dielectric material;
performing, based at least in part on depositing the second dielectric material, a first etching operation to form a plurality of first cavities extending through the first dielectric material and the second dielectric material and exposing at least a portion of each of the plurality of contacts, wherein a first distance between a first row of the first cavities extending in the first direction and a second row of the first cavities extending in the first direction is less than a second distance between the second row of the first cavities and a third row of the first cavities extending in the first direction;
forming, based at least in part on performing the first etching operation, a plurality of conductive pillars electrically coupled with the plurality of contacts based at least in part on depositing a first conductive material in the plurality of first cavities;
depositing, based at least in part on forming the plurality of conductive pillars, a third dielectric material to conformally line surfaces of the plurality of conductive pillars, a bottom surface of the first dielectric material, and a top surface of the substrate;
performing, based at least in part on depositing the third dielectric material, a second etching operation on the third dielectric material exposing a portion of the surfaces of the plurality of conductive pillars, a surface of the third dielectric material, the bottom surface of the first dielectric material, and the top surface of the substrate; and
depositing, based at least in part on performing the second etching operation, a ferroelectric material to conformally line the exposed surfaces of the plurality of conductive pillars, the bottom surface of the first dielectric material, and the top surface of the substrate.

19. The method of claim 18, further comprising:
depositing a mask over the second dielectric material, wherein performing the first etching operation is based at least in part on depositing the mask and the first distance is less than the second distance based at least in part on depositing the mask.

20. The method of claim 18, further comprising:
performing, based at least in part on forming the plurality of conductive pillars, a third etching operation to remove the first dielectric material and form a plurality of second cavities between the plurality of conductive pillars and extending between a bottom surface of the second dielectric material and a top surface of the substrate, wherein depositing the third dielectric material is based at least in part on forming the plurality of second cavities.

* * * * *